United States Patent
Moon et al.

(10) Patent No.: US 11,618,962 B2
(45) Date of Patent: Apr. 4, 2023

(54) NANOWIRE HAVING RUTHENIUM NANOWIRE WITHIN A SILICA NANOTUBE

(71) Applicant: Korea University Research and Business Foundation, Seoul (KR)

(72) Inventors: Jun Hwan Moon, Seoul (KR); Seung Hyun Kim, Incheon (KR); Tae Soon Kim, Seongnam-si (KR); Yoo Sang Jeon, Seoul (KR); Young Keun Kim, Seoul (KR)

(73) Assignee: KOREA UNIVERSITY RESEARCH AND BUSINESS FOUNDATION, Seoul (KR)

( * ) Notice: Subject to any disclaimer, the term of this patent is extended or adjusted under 35 U.S.C. 154(b) by 0 days.

(21) Appl. No.: 17/107,251

(22) Filed: Nov. 30, 2020

(65) Prior Publication Data
US 2021/0404080 A1    Dec. 30, 2021

(30) Foreign Application Priority Data

Jun. 30, 2020    (KR) .......................... 10-2020-0080216

(51) Int. Cl.
| | | |
|---|---|---|
| C25D 1/00 | (2006.01) | |
| C25D 3/02 | (2006.01) | |
| C23C 16/455 | (2006.01) | |
| C23C 16/06 | (2006.01) | |
| C25D 7/06 | (2006.01) | |

(Continued)

(52) U.S. Cl.
CPC .............. C25D 3/02 (2013.01); C23C 16/06 (2013.01); C23C 16/45525 (2013.01); C25D 1/006 (2013.01); C25D 7/0607 (2013.01); B82Y 30/00 (2013.01); B82Y 40/00 (2013.01)

(58) Field of Classification Search
None
See application file for complete search history.

(56) References Cited

U.S. PATENT DOCUMENTS

| | | | |
|---|---|---|---|
| 2008/0008920 A1* | 1/2008 | Alexandrovichserov | .................... H01M 4/8853 429/483 |
| 2008/0096345 A1* | 4/2008 | Zhang | ...................... H01G 9/07 29/25.03 |
| 2013/0084210 A1 | 4/2013 | Wong et al. | |

(Continued)

FOREIGN PATENT DOCUMENTS

| | | |
|---|---|---|
| CN | 100357023 C | 12/2007 |
| KR | 10-2012-0077952 A | 7/2012 |

OTHER PUBLICATIONS

Dobosz et al. (Materials Science & Engineering B 262 '2020' 114795). (Year: 2020).*

(Continued)

*Primary Examiner* — Wojciech Haske
(74) *Attorney, Agent, or Firm* — Hauptman Ham, LLP

(57) ABSTRACT

Disclosed is a technical idea of forming ruthenium and ruthenium-cobalt alloy nanowires having various diameters using electroplating. More particularly, a technology of forming ruthenium and ruthenium-cobalt alloy nanowires on a porous template, on pores of which nanotubes are deposited using atomic layer deposition (ALD), using electroplating, and annealing the ruthenium and ruthenium-cobalt alloy nanowires to form ruthenium-cobalt alloy nanowires having various diameters.

10 Claims, 28 Drawing Sheets

(51) Int. Cl.
*B82Y 30/00* (2011.01)
*B82Y 40/00* (2011.01)

(56) References Cited

U.S. PATENT DOCUMENTS

2014/0329089 A1* 11/2014 Yin .................... B22F 9/18
                                                    428/390
2016/0266460 A1*  9/2016 Kloeppner ............ G02F 1/1533

OTHER PUBLICATIONS

Shibesh Dutta et al., "Finite Size Effects in Highly Scaled Ruthenium Interconnects," IEEE Electron Device Letters, vol. 39, pp. 268-271, 2018.
Erik Milosevic et al., "Resistivity Size Effect in Epitaxial Ru(0001) Layers", Journal of Applied Physics 124, 165105 (2018).
Woo-Hee Kim et al., "Ru nanostructure fabrication using an anodic aluminum oxide nanotemplate and highly conformal Ru atomic layer disposition", Nanotechnology, Institute of Physics Publishing, GB, vol. 19, No. 4, Jan. 30, 2008, 8 Pages.
Extended European Search Report dated May 4, 2021, corresponding to European Application No. 20210612.6.

* cited by examiner

500

510

520

530

540

550

560

800

810

820

830

840

850

920

Phase segregation

Alloying

NANOWIRE HAVING RUTHENIUM NANOWIRE WITHIN A SILICA NANOTUBE

CROSS-REFERENCE TO RELATED APPLICATION

This application claims priority to Korean Patent Application No. 10-2020-0080216, filed on Jun. 30, 2020 in the Korean Intellectual Property Office, the disclosure of which is incorporated herein by reference.

BACKGROUND OF THE DISCLOSURE

Field of the Disclosure

The present disclosure relates to ruthenium (Ru)-based nanowires and a method of manufacturing the same, and more particularly, to a technical idea of forming ruthenium and ruthenium-cobalt alloy nanowires having various diameters using electroplating.

Description of the Related Art

Higher integration of semiconductors is accelerating, which causes a rapid increase in resistance of existing metal wiring, thereby negatively affecting an entire device in terms of transistor speed and energy consumption, etc.

Copper (Cu) metallization, which is widely used in manufacturing processes of integrated circuits including semiconductor devices, is manufactured through electroplating and damascene processes, and requires a TaN barrier and a Ta liner layer, which facilitates Cu plating, to prevent diffusion into a low dielectric constant dielectric surrounding copper metallization.

As the thicknesses of metals decrease below electron average free paths thereof, a resistance magnitude effect wherein a resistivity value rapidly increases is exhibited. In addition, a TaN/Ta double layer structure including a barrier layer and a liner is important to achieve the desired lifespan of a device, but exhibits electrical resistance much higher than in Cu metallization and has difficulty in maintaining a constant thickness (step coverage) on a surface with different steps.

Ruthenium (Ru) has a higher bulk resistivity value than Cu, which has been conventionally used for wiring, but has a low electron mean free path, so that, in the case of a small diameter, a lower resistance value than Cu with the same diameter may be exhibited. In addition, since ruthenium (Ru) has high cohesive energy, it exhibits excellent antidiffusion characteristics, thus being useful as a replacement for existing wiring structures with a single metal.

Most of previous studies have used a method of forming a thin film using physical vapor deposition (PVD), chemical vapor deposition (CVD), and atomic layer deposition (ALD) or a method of forming nanowires through an additional process, so as to evaluate the electrical properties of materials.

That is, in the case of ruthenium according to existing technologies, it is difficult to synthesize a structure having a nanoscale diameter due to generation of hydrogen, which is a competitive reaction, during electroplating. For this reason, most existing technologies for Ru materials have synthesized two-dimensional thin films through high-vacuum processes such as physical vapor deposition or chemical vapor deposition However, the actual structure of semiconductor wiring is a nanowire form, and, unlike a thin film, it has a high aspect ratio and may have different characteristics different from a thin film, due to a low-dimensional structure. Accordingly, it is difficult to provide microstructure changes and electrical properties by diameter and composition for nanowires.

RELATED ART DOCUMENTS

Patent Documents (Non-Patent Document 1) Shibesh Dutta et al., "Finite Size Effects in Highly Scaled Ruthenium Interconnects", IEEE Electron Device Letters 39, 268 (2018).

(Non-Patent Document 2) Erik Milosevic et al., "Resistivity size effect in epitaxial Ru(0001) layers", Journal of Applied Physics 124, 165105 (2018).

SUMMARY OF THE DISCLOSURE

Therefore, the present disclosure has been made in view of the above problems, and it is an object of the present disclosure to provide ruthenium and ruthenium-cobalt alloy nanowires with small diameters which are synthesized using electroplating. Accordingly, a material having lower electrical resistivity than that of existing wiring materials can be provided.

It is another object of the present disclosure to provide ruthenium and ruthenium-cobalt alloy nanowires that act as a barrier for preventing diffusion of a metal line into a low-k dielectric material and a liner for metal line plating and, accordingly, are capable of being used in the form of a single layer in a metallization process; and a method of manufacturing the ruthenium and ruthenium-cobalt alloy nanowires.

In accordance with an aspect of the present disclosure, the above and other objects can be accomplished by the provision of ruthenium nanowires, the ruthenium nanowires being manufactured by depositing nanotubes into pores of a porous template using atomic layer deposition (ALD), and then reducing ruthenium (Ru) in the nanotubes on the porous template using electroplating, wherein a size of crystal grains of the ruthenium nanowires is controlled through annealing after the electroplating.

Silica ($SiO_2$) may be deposited to a thickness of 5 nm to 30 nm on the pores to form silica nanotubes.

The porous template may include any one of a polycarbonate membrane (PCM) and an anodic aluminum oxide (AAO) membrane.

The annealing may be performed at 400° C. to 600° C.

The crystal grains may be controlled to grow to a size of 9 nm to 12 nm at 400° C. to 500° C., or to grow to a size of 55 nm at 600° C. or higher.

In accordance with another aspect of the present disclosure, there are provided ruthenium nanowires, the ruthenium nanowires being manufactured by depositing nanotubes into pores of a porous template using atomic layer deposition (ALD) to form a semiconductor equipment-like structure, and then reducing ruthenium (Ru) in the nanotubes on the porous template using electroplating so that the ruthenium nanowires have a diameter of about 10 nm.

In accordance with an embodiment of the present disclosure, the ruthenium nanowires may be synthesized using electroplating and may replace a metal line of a via, contact and metal line included in a back end of line (BEOL) layer of a semiconductor device or all of the via, the contact, and the metal line.

In accordance with another aspect of the present disclosure, there are provided ruthenium-cobalt alloy nanowires, the ruthenium-cobalt alloy nanowires being formed on a porous template using electroplating after depositing nanotubes into pores of the porous template using atomic layer deposition (ALD), wherein a crystal structure of the ruthenium-cobalt alloy nanowires is controlled according to a content of cobalt (Co), and electrical resistivity is reduced through annealing.

In accordance with an embodiment of the present disclosure, a ruthenium (Ru)-cobalt (Co) complete solid solution may be formed through the annealing so that the electrical resistivity is reduced.

Cobalt (Co) of the ruthenium (Ru)-cobalt (Co) complete solid solution may move into a ruthenium (Ru) matrix after the annealing.

The annealing may be performed at 400° C. to 600° C.

A content of the cobalt (Co) may be 1 at % to 96 at %, wherein the crystal structure is controlled to an amorphous-like structure when the content of the cobalt (Co) is 1 at % to 48 at %.

In accordance with an embodiment of the present disclosure, a size of the crystal grains may increase when the content of the cobalt (Co) increases, and the content of cobalt (Co) may be controlled by adjusting at least one of a precursor concentration of cobalt (Co) and a current density.

In accordance with an embodiment of the present disclosure, the ruthenium-cobalt alloy nanowires may be applied as at least one of a barrier and a liner to at least one of a via, contact and metal line included in a back end of line (BEOL) layer of a semiconductor device.

In accordance with another aspect of the present disclosure, there is provided a method of manufacturing ruthenium nanowires, the method including: forming ruthenium nanowires on a porous template, on pores of which nanotubes are deposited using atomic layer deposition (ALD), using electroplating; and annealing the formed ruthenium nanowires, wherein the annealing includes controlling a size of crystal grains of the formed ruthenium nanowires.

The annealing may be performed at 400° C. to 600° C. and may include controlling such that the crystal grains grow to a size of 9 nm to 12 nm at 400° C. to 500° C. and grow to a size of 55 nm at 600° C. or higher.

In accordance with yet another aspect of the present disclosure, there is provided a method of manufacturing ruthenium-cobalt alloy nanowires, the method including: forming ruthenium-cobalt alloy nanowires on a porous template using electroplating after depositing nanotubes into pores of the porous template using atomic layer deposition (ALD); and annealing the formed ruthenium-cobalt alloy nanowires, wherein the forming includes controlling a crystal structure of the ruthenium-cobalt alloy nanowires according to a content of cobalt (Co).

The annealing may include forming a ruthenium (Ru)-cobalt (Co) complete solid solution through the annealing to reduce electrical resistivity.

The forming may include determining the content of cobalt (Co) to any one of 1 at % to 96 at % and, when the content of cobalt (Co) is 1 at % to 48 at %, controlling the crystal structure to an amorphous-like structure.

In the forming, the ruthenium-cobalt alloy nanowires may be formed using electroplating in an environment in which a current density of 1.25 mA/cm$^2$ to 5.00 mA/cm$^2$ is applied, so as to simultaneously reduce the ruthenium and the cobalt.

The forming may include adjusting at least one of a precursor concentration of cobalt (Co) and a current density to control the content of cobalt (Co).

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION OF THE DISCLOSURE

Figure 1:
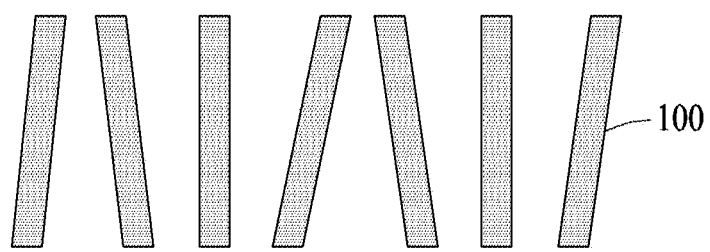
FIG. 1 illustrates ruthenium-based nanowires according to an embodiment of the present disclosure.

The present disclosure will now be described more fully with reference to the accompanying drawings, in which exemplary embodiments of the disclosure are shown.

This disclosure, however, should not be construed as limited to the exemplary embodiments and terms used in the exemplary embodiments, and should be understood as including various modifications, equivalents, and substituents of the exemplary embodiments.

Preferred embodiments of the present disclosure are now described more fully with reference to the accompanying drawings. In the description of embodiments of the present disclosure, certain detailed explanations of related known functions or constructions are omitted when it is deemed that they may unnecessarily obscure the essence of the disclosure.

In addition, the terms used in the specification are defined in consideration of functions used in the present disclosure, and can be changed according to the intent or conventionally used methods of clients, operators, and users. Accordingly, definitions of the terms should be understood on the basis of the entire description of the present specification.

In the drawings, like reference numerals in the drawings denote like elements.

As used herein, the singular forms "a," "an" and "the" are intended to include the plural forms as well, unless context clearly indicates otherwise.

Expressions such as "A or B" and "at least one of A and/or B" should be understood to include all possible combinations of listed items.

Expressions such as "a first," "the first," "a second" and "the second" may qualify corresponding components irrespective of order or importance and may be only used to distinguish one component from another component without being limited to the corresponding components.

In the case in which a (e.g., first) component is referred as "(functionally or communicatively) connected" or "attached" to another (e.g., second) component, the first component may be directly connected to the second component or may be connected to the second component via another component (e.g., third component).

In the specification, the expression " . . . configured to . . . (or set to)" may be used interchangeably, for example, with expressions, such as " . . . suitable for . . . ," " . . . having ability to . . . ," " . . . modified to . . . ," " . . . manufactured to . . . ," " . . . enabling to . . . ," or " . . . designed to . . . ," in the case of hardware or software depending upon situations.

In any situation, the expression "a device configured to . . . " may refer to a device configured to operate "with another device or component."

For examples, the expression "a processor configured (or set) to execute A, B, and C" may refer to a specific processor performing a corresponding operation (e.g., embedded processor), or a general-purpose processor (e.g., CPU or application processor) executing one or more software programs stored in a memory device to perform corresponding operations.

In addition, the expression "or" means "inclusive or" rather than "exclusive or".

That is, unless otherwise mentioned or clearly inferred from context, the expression "x uses a or b" means any one of natural inclusive permutations.

Hereinafter, the terms, such as 'unit' or 'module', etc., should be understood as a unit that processes at least one function or operation and that may be embodied in a hardware manner, a software manner, or a combination of the hardware manner and the software manner.

FIG. 1 illustrates ruthenium-based nanowires according to an embodiment of the present disclosure.

Referring to FIG. 1, the ruthenium-based nanowires 100 according to an embodiment of the present disclosure include ruthenium nanowires and ruthenium-cobalt alloy nanowires. The ruthenium-based nanowires 100 may be formed using electroplating and may be implemented to have an amorphous structure and a relatively low electrical resistivity.

For example, the ruthenium-based nanowires 100 may act as a barrier for preventing diffusion of a metal line into a low-k dielectric material and as a liner for metal line plating, thereby being used in a metallization process in the form of a single layer.

For example, the ruthenium-based nanowires 100 exhibit excellent anti-diffusion characteristics compared to existing copper (Cu), thereby not requiring a barrier layer for preventing diffusion into a dielectric. Accordingly, the ruthenium-based nanowires 100 may be used in the form of a single layer in a metal wiring process and may be applied to a semiconductor damascene process using electroplating.

In accordance with an embodiment of the present disclosure, ruthenium nanowires may be formed by depositing nanotubes on pores of a porous template using atomic layer deposition (ALD), and then reducing ruthenium (Ru) in the nanotubes on the porous template using electroplating. Here, the size of crystal grains may be controlled through annealing.

For example, silica nanotubes may be formed by depositing silica ($SiO_2$) to a thickness of 5 nm to 30 nm on the pores.

For example, the porous template may include any one of a polycarbonate membrane (PCM) and an anodic aluminum oxide (AAO) membrane.

In accordance with an embodiment of the present disclosure, the ruthenium nanowires may be annealed at 400° C. to 600° C. Crystal grains may be controlled to grow to a size of 9 nm to 12 nm at an annealing temperature of 400° C. to 500° C. or to 55 nm upon crystal growth at an annealing temperature of 600° C. or higher.

In accordance with an embodiment of the present disclosure, nanotubes are deposited on pores of a porous template using ALD, and then ruthenium-cobalt alloy nanowires are formed on the porous template using electroplating. Here, the crystal structure of the ruthenium-cobalt alloy nanowires may be controlled depending upon the content of cobalt (Co), and electrical resistivity may be reduced through annealing.

For example, a ruthenium (Ru)-cobalt (Co) complete solid solution may be formed in the ruthenium-cobalt alloy nanowires through annealing, so that electrical resistivity may be reduced.

For example, cobalt (Co) in the complete solid solution may move into the ruthenium (Ru) matrix after annealing.

In accordance with an embodiment of the present disclosure, the content of cobalt (Co) in the ruthenium-cobalt alloy nanowires may be 1 at % to 96 at %. When the content of cobalt (Co) is 1 at % to 48 at %, the crystal structure may be controlled in the form of an amorphous-like structure.

For example, when the content of cobalt (Co) increases, the size of crystal grains may increase.

Here, the content of cobalt (Co) may be controlled by adjusting at least one of a precursor concentration of cobalt (Co) and a current density.

Figure 2:
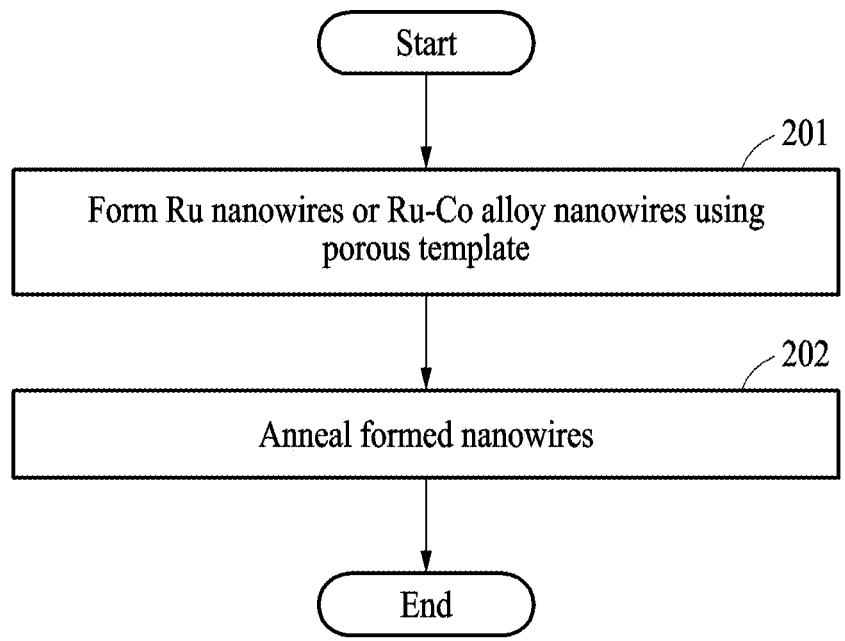
FIG. 2 illustrates a method of manufacturing ruthenium-based nanowires according to an embodiment of the present disclosure.

FIG. 2 illustrates a method of manufacturing ruthenium-based nanowires according to an embodiment of the present disclosure.

Referring to FIG. 2, in step 201 of the method of manufacturing ruthenium-based nanowires according to an embodiment of the present disclosure, ruthenium nanowires or ruthenium-cobalt alloy nanowires are formed using a porous template.

That is, the method of manufacturing ruthenium-based nanowires includes forming ruthenium nanowires or ruthenium-cobalt alloy nanowires, which correspond to ruthenium-based nanowires, on a porous template, on pores of which nanotubes have been deposited using ALD, using electroplating.

In step 202, the nanowires formed by step 201 of the method of manufacturing ruthenium-based nanowires are annealed.

That is, the method of manufacturing ruthenium-based nanowires includes annealing at 400° C. to 600° C., thereby being capable of controlling the size of crystal grains of the ruthenium nanowires or reducing electrical resistivity.

Figure 3:
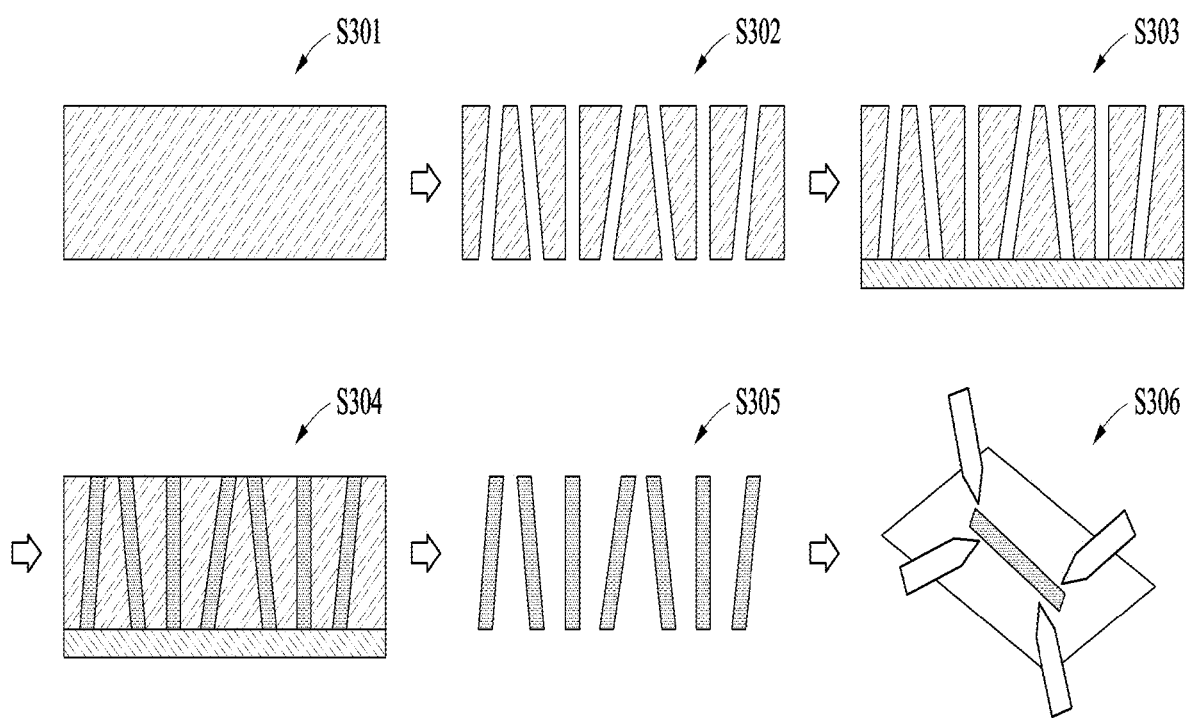
FIG. 3 illustrates a procedure of manufacturing ruthenium-based nanowires according to an embodiment of the present disclosure and measuring electrical properties thereof.

FIG. 3 illustrates a procedure of manufacturing ruthenium-based nanowires according to an embodiment of the present disclosure and measuring electrical properties thereof.

In particular, FIG. 3 illustrates a procedure of forming ruthenium nanowires using electroplating according to an embodiment of the present disclosure, and then measuring and analyzing electrical properties of the ruthenium nanowires.

Referring to FIG. 3, in steps S301 and S302, a porous template is prepared, and the prepared porous template is placed in a plating bath. Here, as the porous template, an ion-irradiated a polycarbonate membrane (PCM) or anodic aluminum oxide (AAO) membrane may be used. For example, the porous template may be referred to as a nanoframe or a nanotemplate.

In step S303, silver (Ag) may be deposited to a thickness of 300 nm on one side surface of the porous template with by means of an e-beam evaporator such that electroplating is conducted. For example, the deposited silver may be used as a working electrode for electroplating, and a platinum electrode plate may be used as a counter electrode thereof.

Deionized water-based solution to be contained in a plating bath may include ruthenium chloride ($RuCl_3$, 0.02 M) or ruthenium chloride.xhydrate ($RuCl_3$ alt sulfate hydrate ($RuCl_3.xH_2O$, 0.20 M) as a precursor; boric acid ($H_3BO_3$, 0.40 M) as a buffering agent; and potassium chloride (KCl, 0.50 M), hydrochloric acid (HCl, 0.50 M), perchloric acid ($HClO_4$ 0.50 M), or ammonium chloride ($NH_4Cl$, 0.50 M) as an additive.

For example, the deionized water-based solution may further include boric acid ($H_3BO_3$) and citric acid ($C_6H_8O_7$) as buffering agents; and sodium citrate tribasic dihydrate ($C_6H_7Na_3O_8$) as an additive.

In step S304, a current density of 1.25 $mA/cm^2$ to 5.00 $mA/cm^2$ may be applied to reduce ruthenium in a single bath state.

In step S305, the working electrode may be removed with an adhesive tape, and the porous template may be selectively removed using a dichloromethane solution ($CH_2Cl_2$). Next, ruthenium-based nanowires present in the porous template may be separated and formed by washing five or more times with a chloroform solution ($CHCl_3$) and acetone by means of a centrifuge.

In step S306, the electrical properties of the ruthenium-based nanowires may be measured and analyzed using a probe. For the analysis, a high-resolution transmission electron microscopy (HR-TEM), and an electron microscope with a selected area electron diffraction (SAED) function may be used.

Figure 4A:
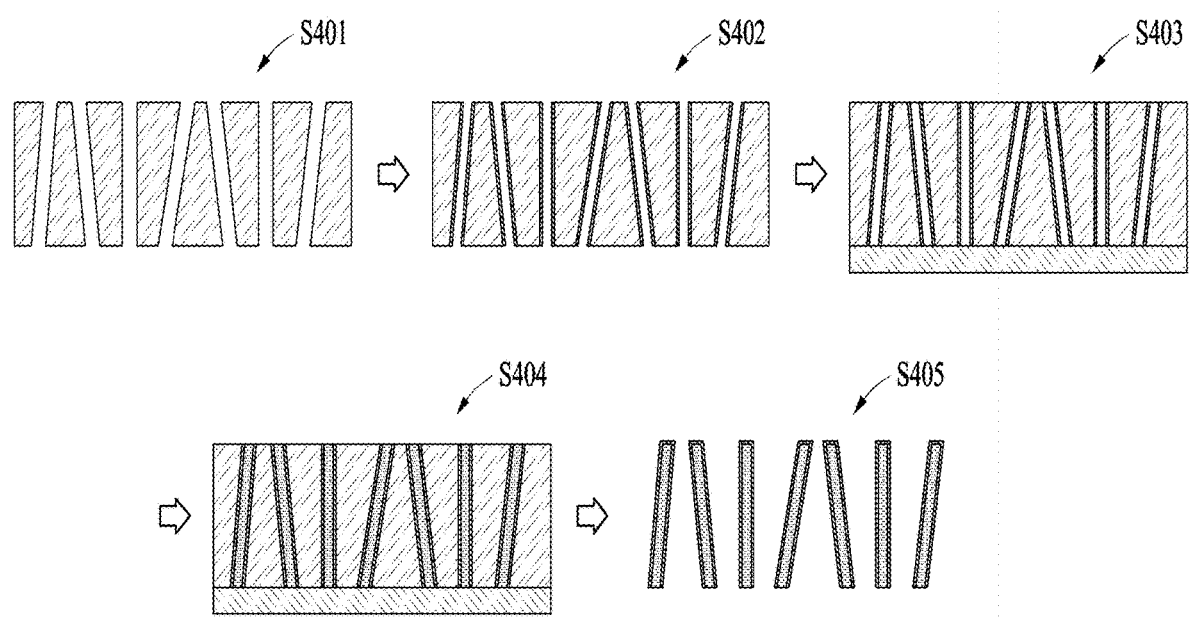
FIG. 4A illustrates a procedure of manufacturing silica film-coated ruthenium nanowires according to an embodiment of the present disclosure.

FIG. 4A illustrates a procedure of manufacturing silica film-coated ruthenium nanowires according to an embodiment of the present disclosure.

Referring to FIG. 4A, in step S401, a track-etched polycarbonate membrane is prepared as a porous template.

In step S402, silica ($SiO_2$) may be deposited to a thickness of 5 nm to 30 nm into pores of the polycarbonate membrane using ALD to form silica nanotubes in the pores of the porous template.

In step S403, silver (Ag) may be deposited to a thickness of 300 nm on one side surface of the porous template with by means of an e-beam evaporator such that electroplating is conducted. For example, the deposited silver may be used as a working electrode for electroplating, and a platinum electrode plate may be used as a counter electrode thereof.

In step S404, a current density of 1.25 $mA/cm^2$ to 5.00 $mA/cm^2$ may be applied to reduce ruthenium in a single bath state.

In step S405, the working electrode may be removed with an adhesive tape, and the porous template may be selectively removed using a dichloromethane solution ($CH_2Cl_2$). Next, ruthenium-based nanowires present in the porous template may be separated and formed by washing five or more times with a chloroform solution ($CHCl_3$) and acetone by means of a centrifuge.

For example, the ruthenium-based nanowires formed through the formation of the silica nanotubes have pore diameters smaller than in existing cases, and may be formed in a band of about 10 nm.

Figure 4B:
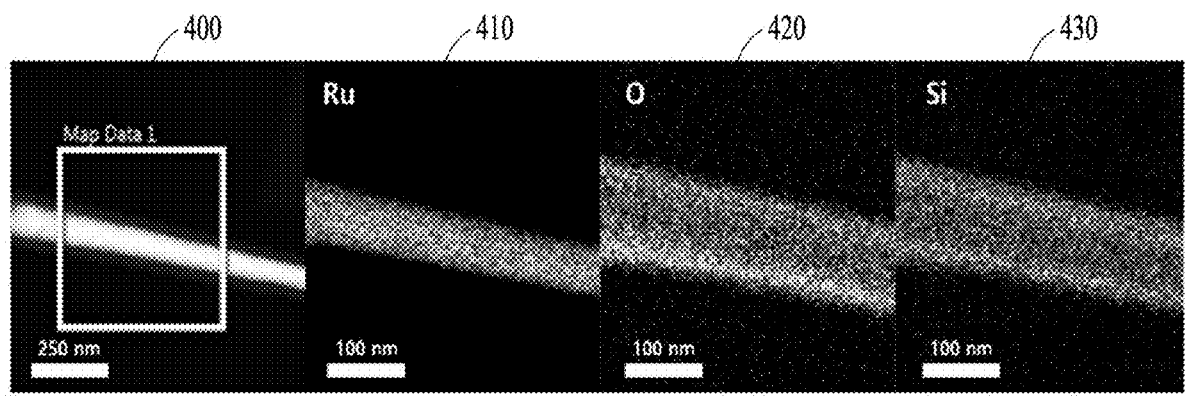
FIG. 4B illustrates transmission electron microscope images of silica film-coated ruthenium nanowires according to an embodiment of the present disclosure.

FIG. 4B illustrates transmission electron microscope images of silica film-coated ruthenium nanowires according to an embodiment of the present disclosure.

Referring to FIG. 4B, the growth of ruthenium nanowires in silica nanotubes is observed using an energy dispersive x-ray spectroscopy (EDX).

When a ruthenium nanowire image 400A is enlarged, a ruthenium element distribution image 410, an oxygen element distribution image 420, and a silica (Si) element distribution image 430 are seen.

For example, the ruthenium nanowires may be formed by performing electroplating in a state in which inner walls of pores of a porous template are coated with a silica film.

FIGS. 5A to 5G illustrate transmission electron microscope images of ruthenium nanowires with different diameters according to embodiments of the present disclosure.

FIGS. 5A to 5D illustrate the shapes and microstructures of ruthenium nanowires with different diameters analyzed using a high-resolution transmission electron microscopy (HR-TEM) and selected area electron diffraction (SAED).

Figure 5A:
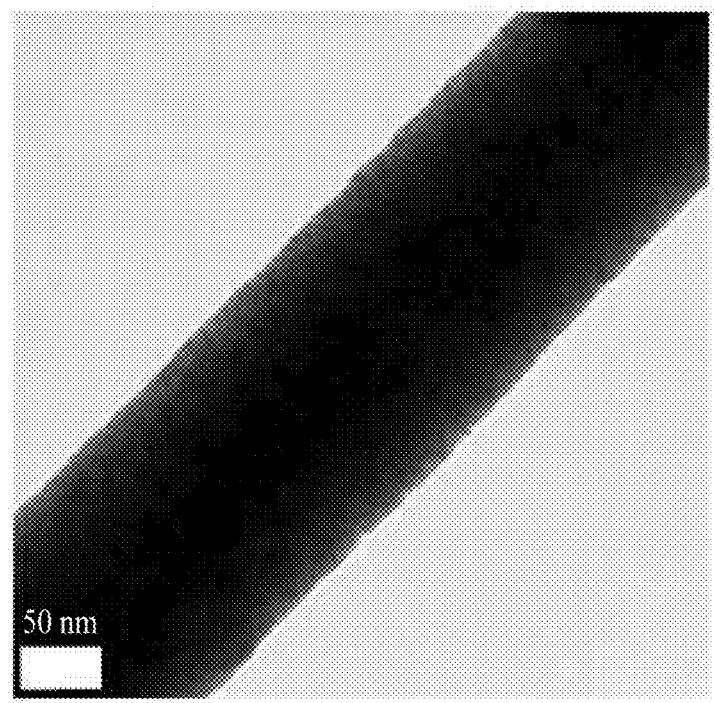
FIGS. 5A to 5G illustrate transmission electron microscope images of ruthenium nanowires with different diameters according to embodiments of the present disclosure.
Figure 5B:
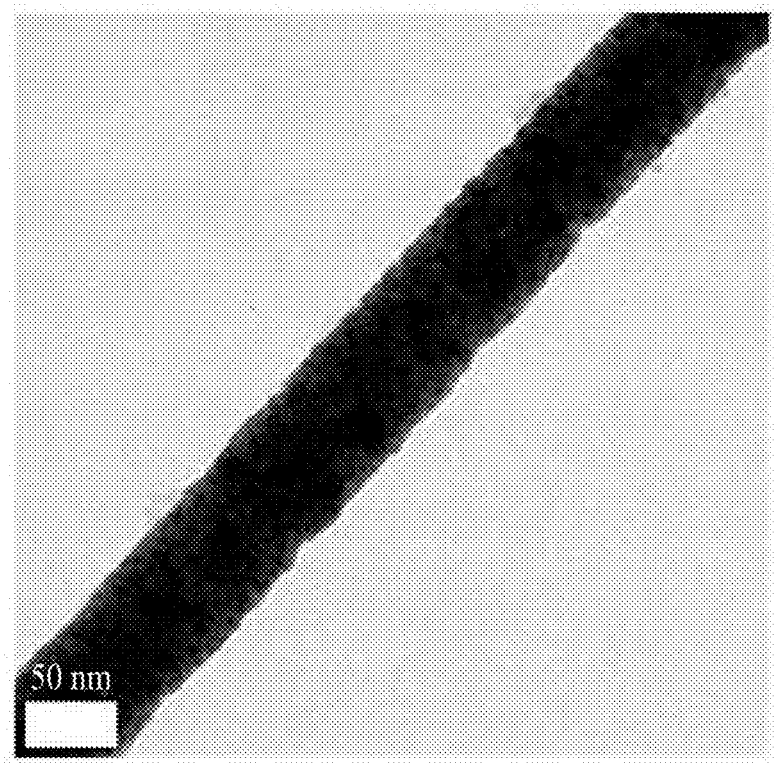
Figure 5C:
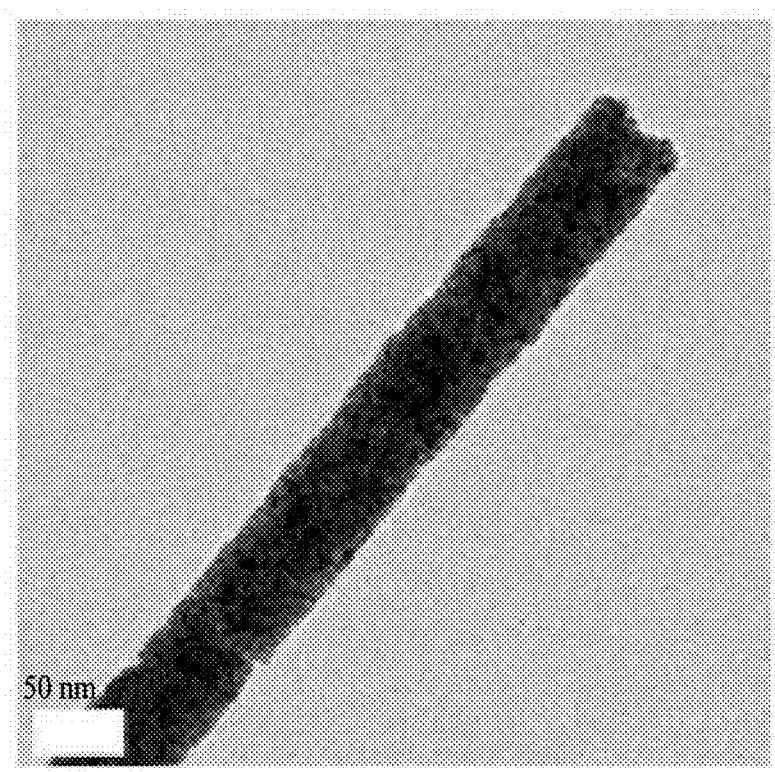
Figure 5D:
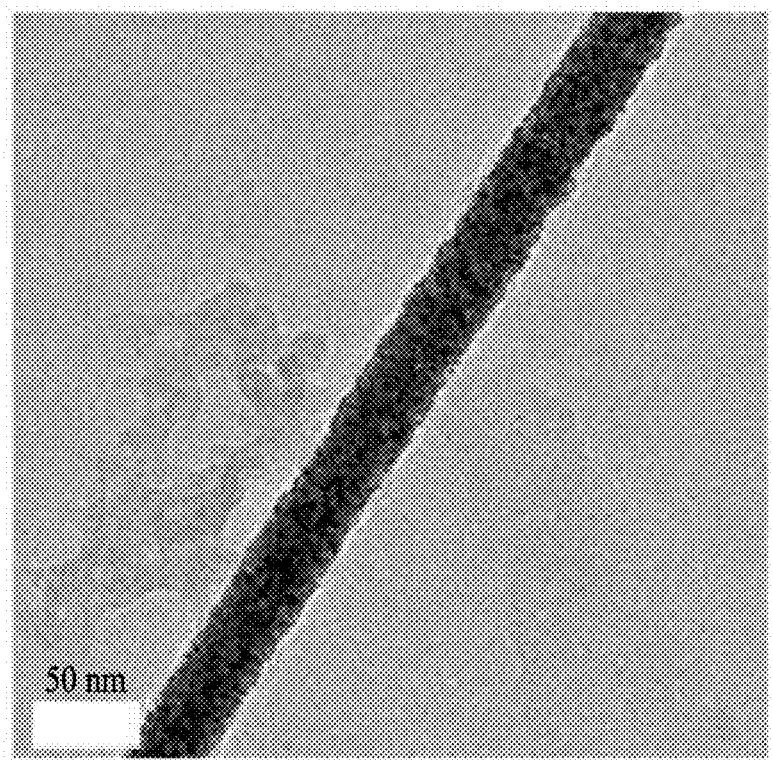
Figure 5E:
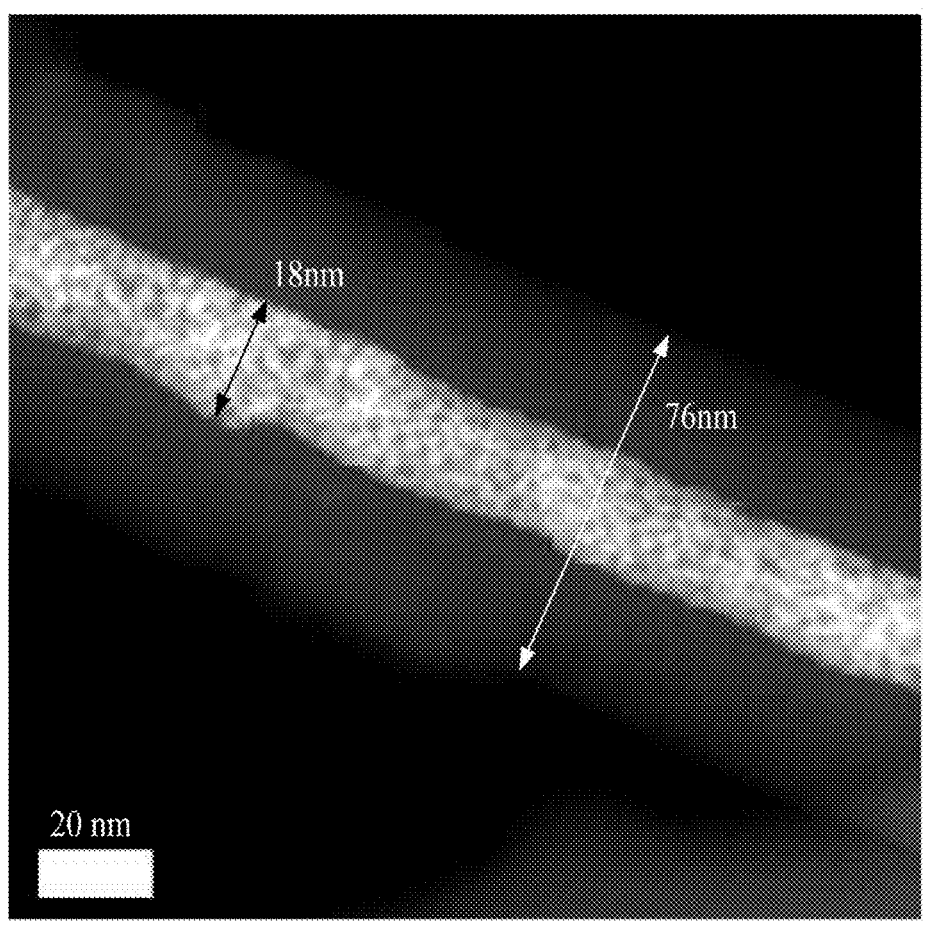
Figure 5F:
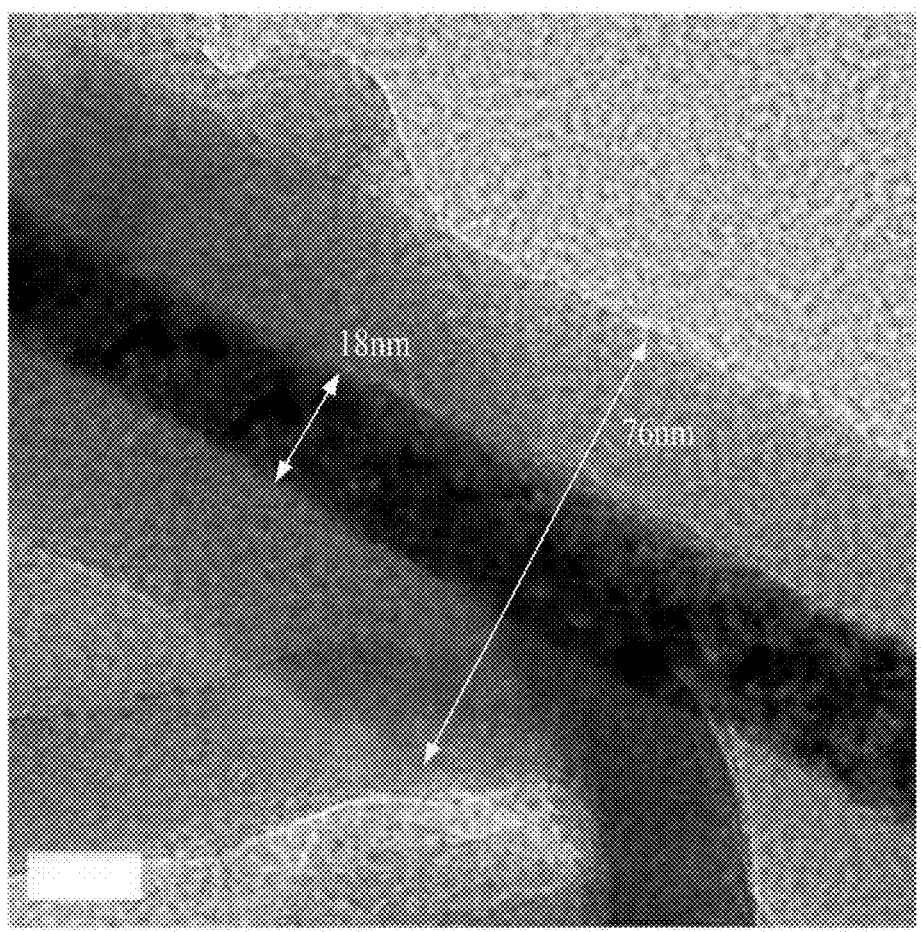
Figure 5G:
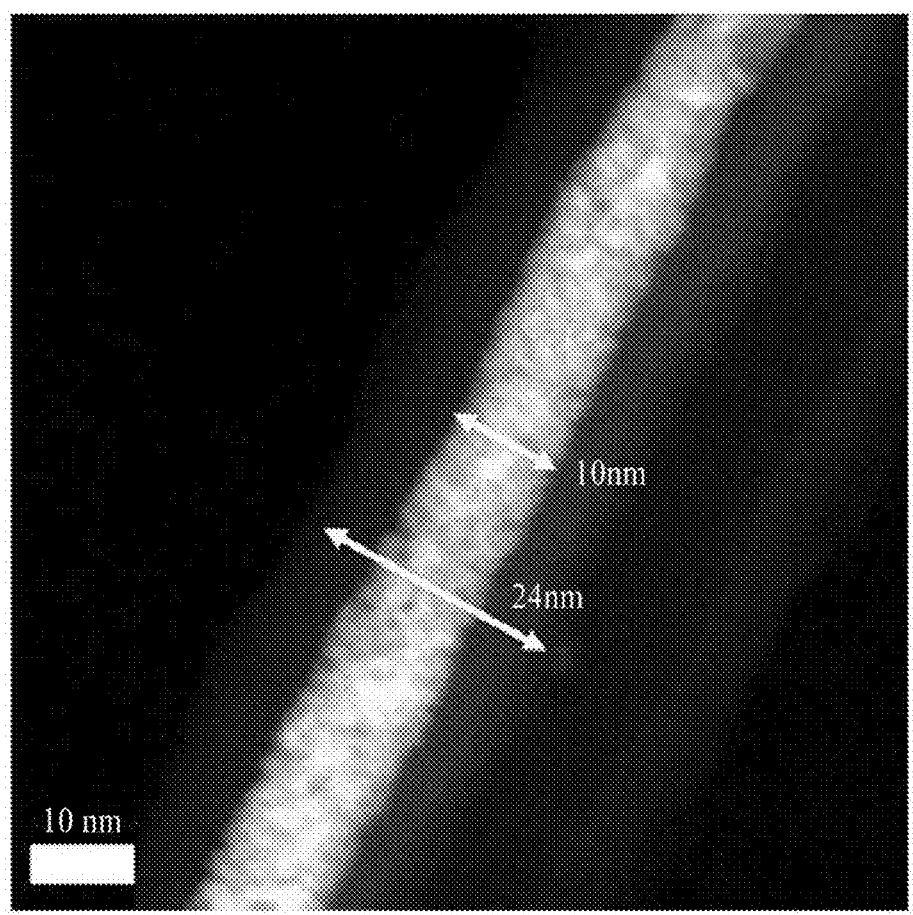

In addition, FIGS. 5E and 5G illustrate ruthenium nanowires that have pores with diameters smaller than in existing cases through synthesis of silica nanotubes, and that are in a band area of 10 nm grown through subsequent electroplating.

Image 500 illustrates a ruthenium nanowire having a diameter of 130 nm, image 510 illustrates a ruthenium nanowire having a diameter of 70 nm, image 520 illustrates a ruthenium nanowire having a diameter of 60 nm, image 530 illustrates a ruthenium nanowire having a diameter of 35 nm, and images 540 and 550 illustrate a ruthenium nanowire with a diameter of 18 nm present in a silica nanotube.

Referring to images 540 and 550, the total diameter of the silica nanotube and the ruthenium nanowire may be 76 nm.

In addition, examining image 560, a ruthenium nanowire with a diameter of about 10 nm which is present in a silica nanotube is illustrated.

Accordingly, the ruthenium nanowires according to an embodiment of the present disclosure may be formed to have a diameter of about 10 nm by depositing nanotubes in pores of a porous template to form a semiconductor equipment-like structure, and then by reducing ruthenium on the porous template using electroplating.

That is, ruthenium nanowires having a diameter of about 10 nm may be synthesized using electroplating according to an embodiment of the present disclosure.

Figure 6A:
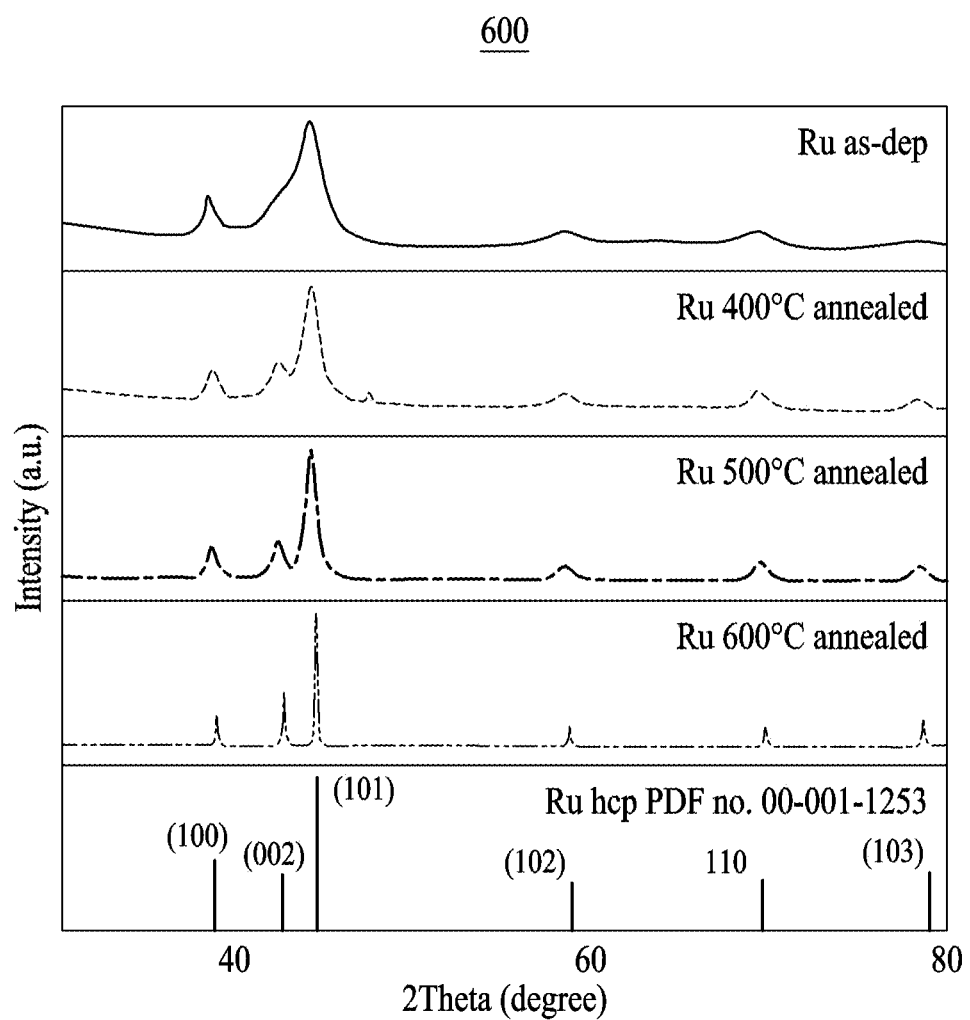
FIG. 6A illustrates X-ray diffraction analysis results of ruthenium nanowires by heat treatment temperature according to embodiments of the present disclosure.

FIG. 6A illustrates X-ray diffraction analysis results of ruthenium nanowires by heat treatment temperature according to embodiments of the present disclosure.

More particularly, FIG. 6A illustrates X-ray diffraction (XRD) analysis graphs by heat treatment temperature of nanowires having a diameter of 130 nm.

Referring to FIG. 6A, graph 600 illustrates intensity by degree, and X-ray diffraction (XRD) and microstructure analysis results by heat treatment temperature of ruthenium nanowires with a diameter of 130 nm.

Referring to graph 600, annealing was performed for 1 hour under a vacuum of $6\times10^{-5}$ Torr. Particularly, the size of crystal grains is not significantly changed at 400 and 500° C., but the size of crystal grains rapidly increases at 600° C. or higher. Movement to a smaller angle occurs as an annealing temperature elevates.

Figure 6B:
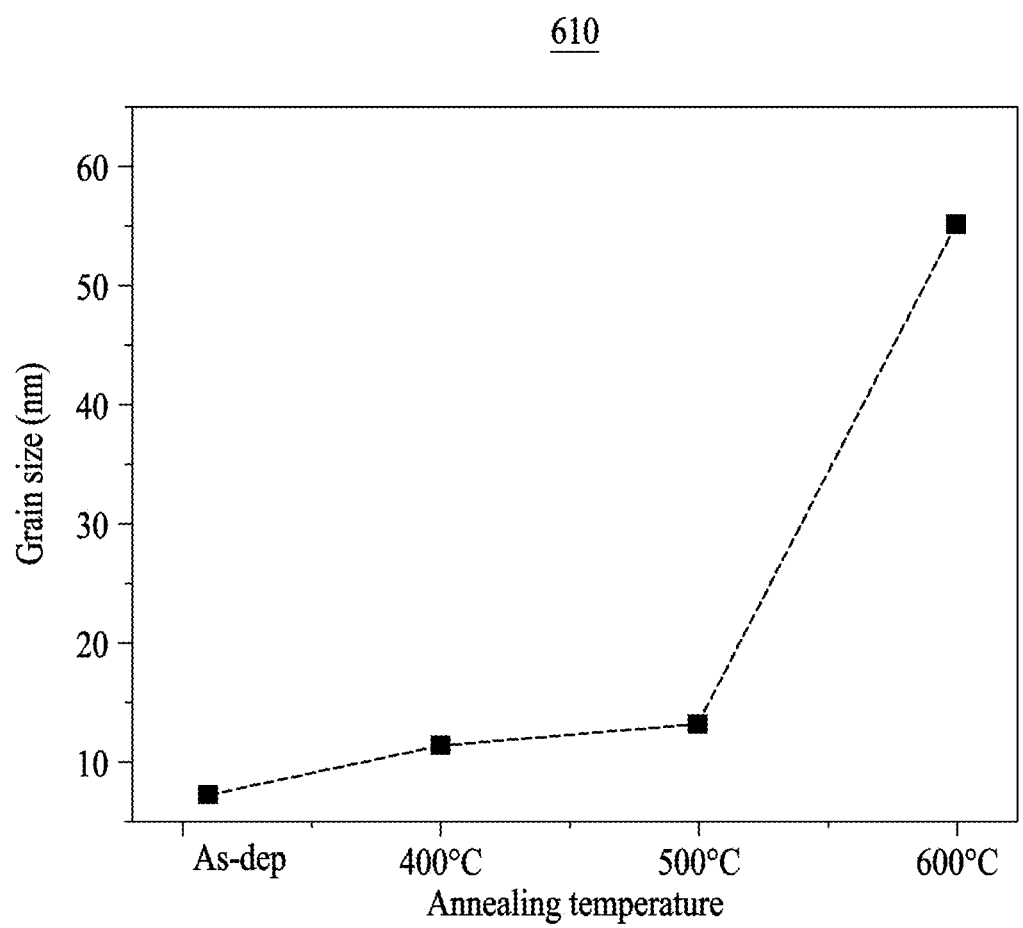
FIG. 6B illustrates heat treatment temperature-dependent crystal grain size changes of ruthenium nanowires according to an embodiment of the present disclosure.

FIG. 6B illustrates heat treatment temperature-dependent crystal grain size changes of ruthenium nanowires according to an embodiment of the present disclosure.

In particular, graph 610 of FIG. 6B illustrates the size of crystal grains calculated using the Scherrer equation.

Referring to FIG. 6B, graph 610 illustrates crystal grain size changes dependent upon annealing temperature changes.

In accordance with an embodiment of the present disclosure, crystal grains of the ruthenium nanowires may be controlled to grow to a size of 9 nm to 12 nm at 400° C. to 500° C., or may be controlled to grow to a size of about 55 nm at 600° C. or higher.

Figure 7A:
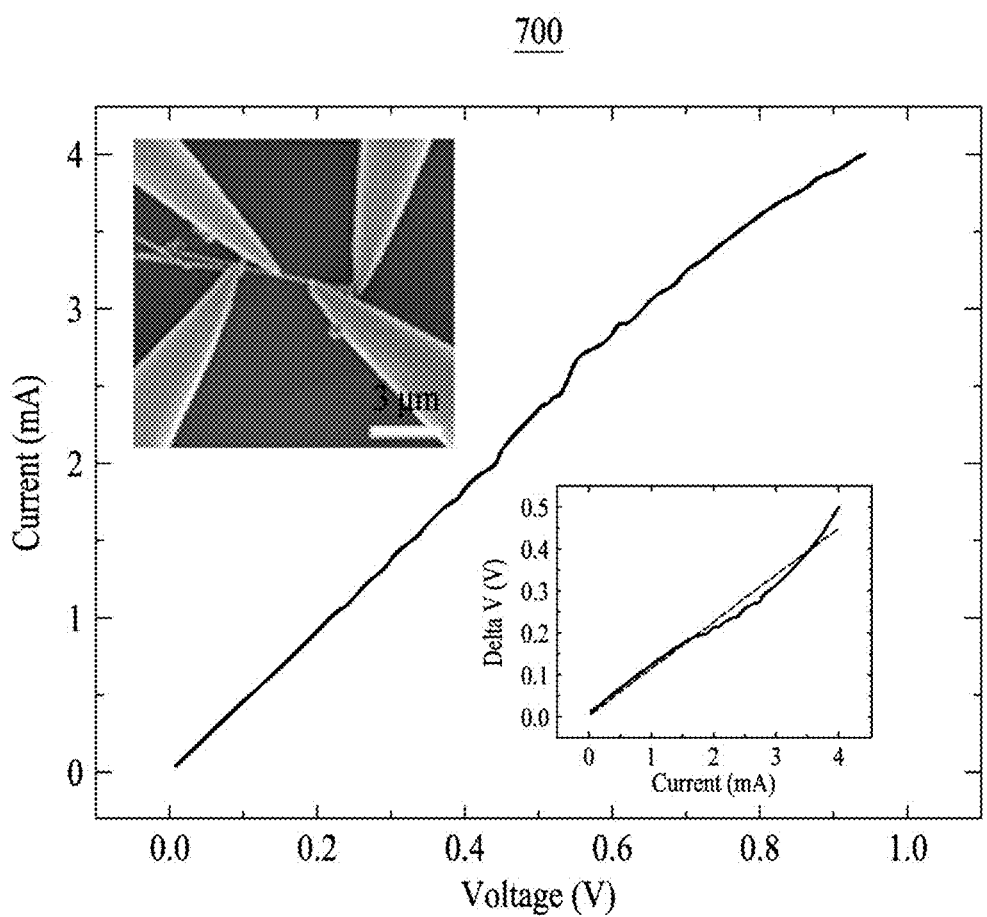
FIGS. 7A and 7B illustrate electrical property changes of ruthenium nanowires according to an embodiment of the present disclosure.
Figure 7B:
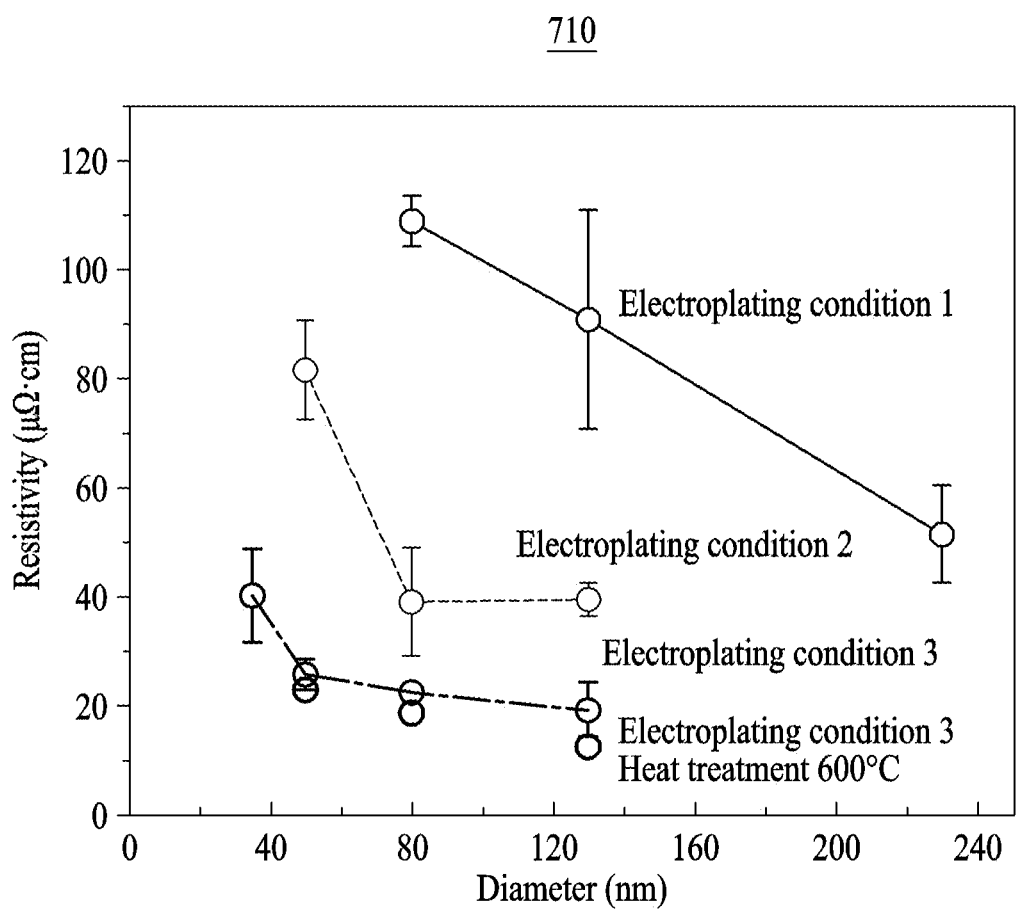

FIGS. 7A and 7B illustrate electrical property changes of ruthenium nanowires according to an embodiment of the present disclosure.

Graph 700 of FIG. 7A illustrates a result of ruthenium nanowires, dispersed on a substrate, measured using a focused ion beam (FIB) to which 4 nanoprobes are attached. For example, the substrate may be a Si/SiO$_2$ a substrate and may have a thickness of 300 nm.

In addition, four nanoprobes were used to remove contact resistance between the nanowires and the nanoprobes, and lead (Pt) was deposited on ends of the nanowires using an electron beam to fix the nanowires to the substrate.

Graph 700 illustrates a current change dependent upon an input voltage, and the small graph in graph 700 illustrates a delta voltage change dependent upon a current.

Referring to FIG. 7B, graph 710 illustrates diameter change-dependent electrical resistivity changes in the ruthenium nanowires.

From graph 710, it can be confirmed that electrical resistance is greatly improved by an electroplating condition.

Graph 710 illustrates electroplating process condition 1 (RuCl$_3$xH$_2$O 20 mol/L, HBO$_3$ 400 mol/L, HCl 500 mol/L), electroplating process condition 2 (RuCl$_3$xH$_2$O 20 mol/L, HBO$_3$ 400 mol/L, KCl 500 mol/L), and electroplating process condition 3 (RuCl$_3$ 20 mol/L, HBO$_3$ 400 mol/L, KCl 500 mol/L).

In addition, from graph 710, it can be confirmed that resistance increases with decreasing diameter. In addition, it can be confirmed that, when electroplating process condition 3 is compared to a heat treatment condition of 600° C., an electrical property is slightly improved after being heat-treated at 600° C.

FIGS. 8A to 8F illustrate transmission electron microscope images and electronic diffraction analysis patterns by composition of ruthenium-cobalt alloy nanowires according to embodiments of the present disclosure.

Figure 8A:
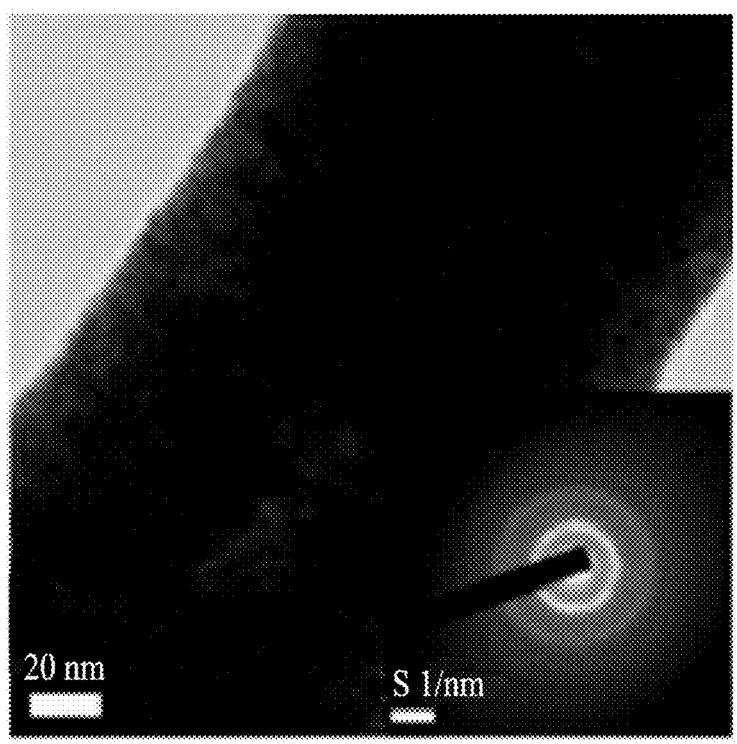
FIGS. 8A to 8F illustrate transmission electron microscope images and electronic diffraction analysis patterns by composition of ruthenium-cobalt alloy nanowires according to embodiments of the present disclosure.
Figure 8B:
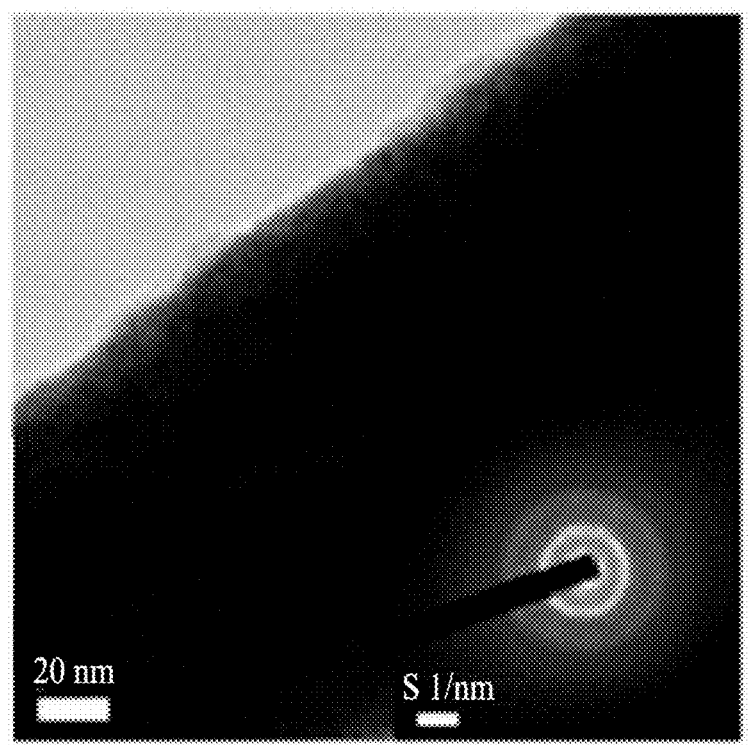
Figure 8C:
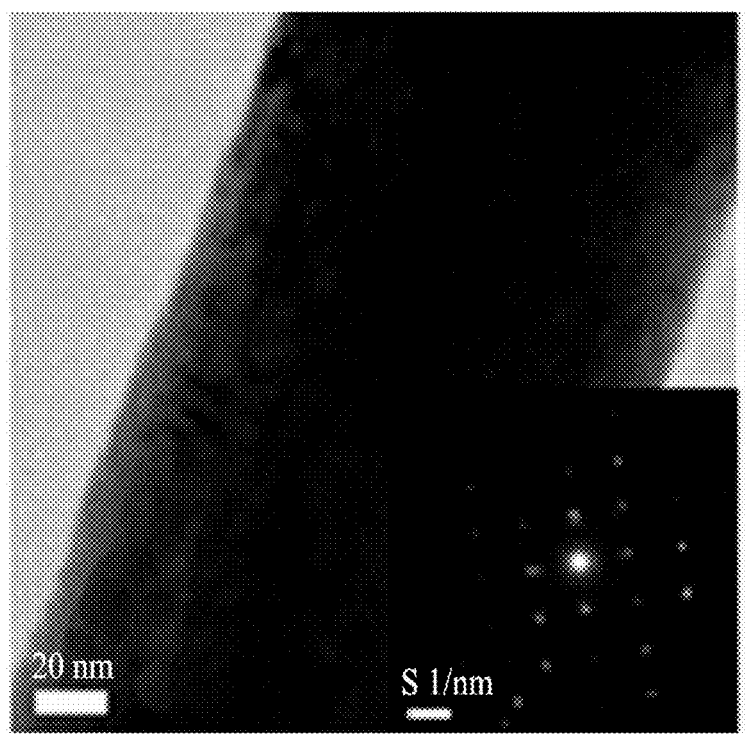
Figure 8D:
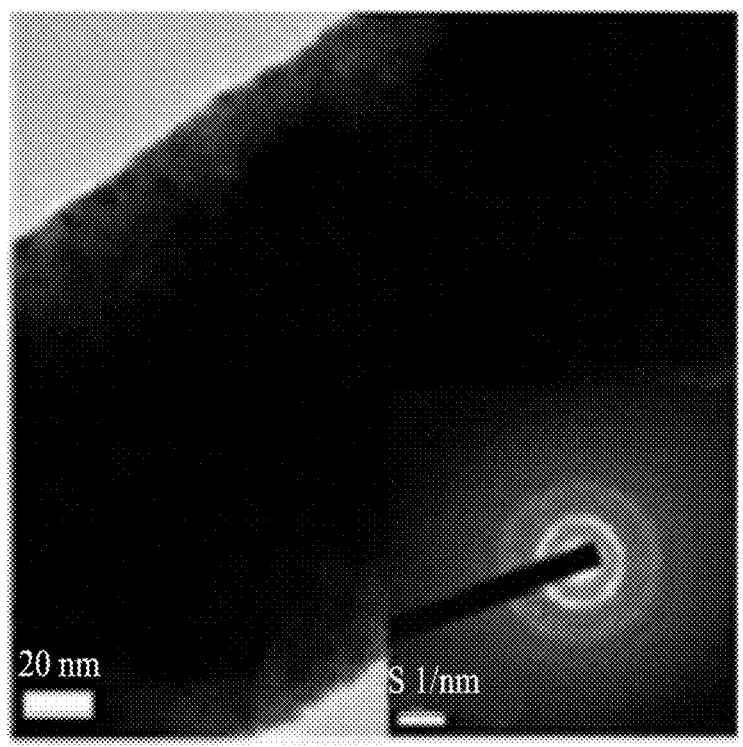
Figure 8E:
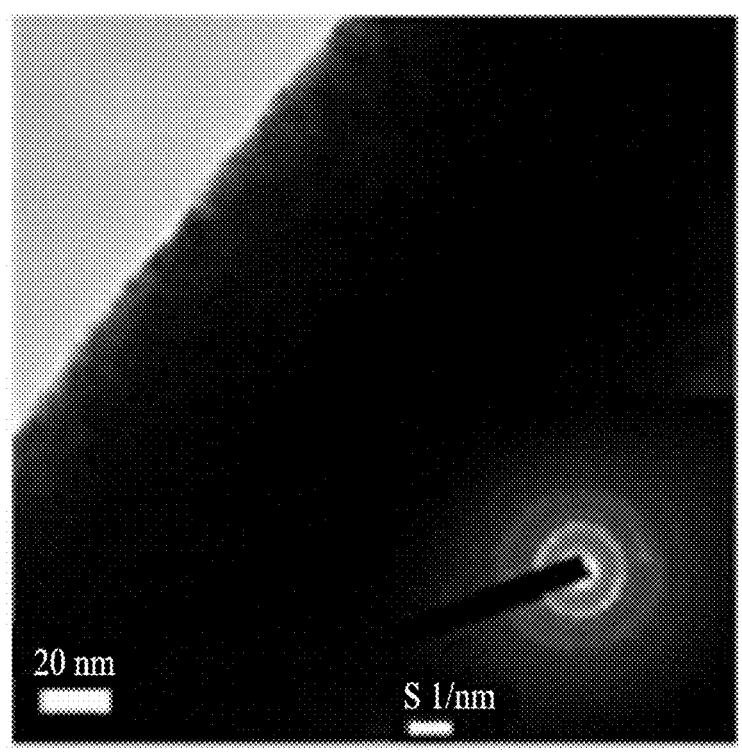
Figure 8F:
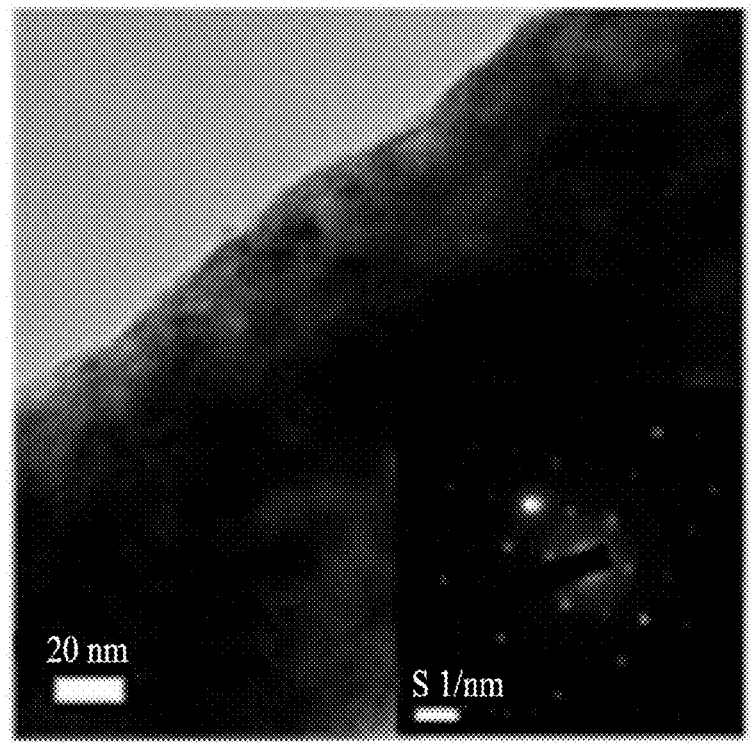

Image 800 of FIG. 8A and image 830 of FIG. 8D illustrate ruthenium-cobalt alloy nanowires when the content of cobalt is 1 at %, image 810 of FIG. 8B and image 840 of FIG. 8E illustrate ruthenium-cobalt alloy nanowires when the content of cobalt is 48 at %, and image 820 of FIG. 8C and image 850 of FIG. 8F illustrate ruthenium-cobalt alloy nanowires when the content of cobalt is 96 at %.

More particularly, referring images 800 and 810, the ruthenium-cobalt alloy nanowires wherein the content of cobalt is 1 at % or 48 at % may exhibit a ring pattern.

This may indicate that the ruthenium-cobalt alloy nanowires wherein the content of cobalt is 1 at % or 48 at % have a nanocrystal structure, thereby having an amorphous shape.

In addition, the ruthenium-cobalt alloy nanowires of images 830, 840 and 850 respectively correspond to images obtained by annealing the ruthenium-cobalt nanowires of images 800, 810 and 820 at 450° C. for 3 hours. Selected area electron diffraction (SAED) patterns were observed after annealing, and, as a result, changes in microstructures were observed.

That is, when the content of cobalt (Co) in the ruthenium-cobalt nanowires is 1 at % to 48 at %, the crystal structure may be controlled to an amorphous-like structure.

FIGS. 9A to 9D illustrate composition-dependent X-ray diffraction analysis results and cobalt composition-dependent crystal grain size changes of ruthenium-cobalt alloy nanowires according to embodiments of the present disclosure.

More particularly, FIGS. 9A to 9D illustrate X-ray diffraction (XRD) analysis results by composition of ruthenium-cobalt alloy nanowires with a diameter of 130 nm.

Figure 9A:
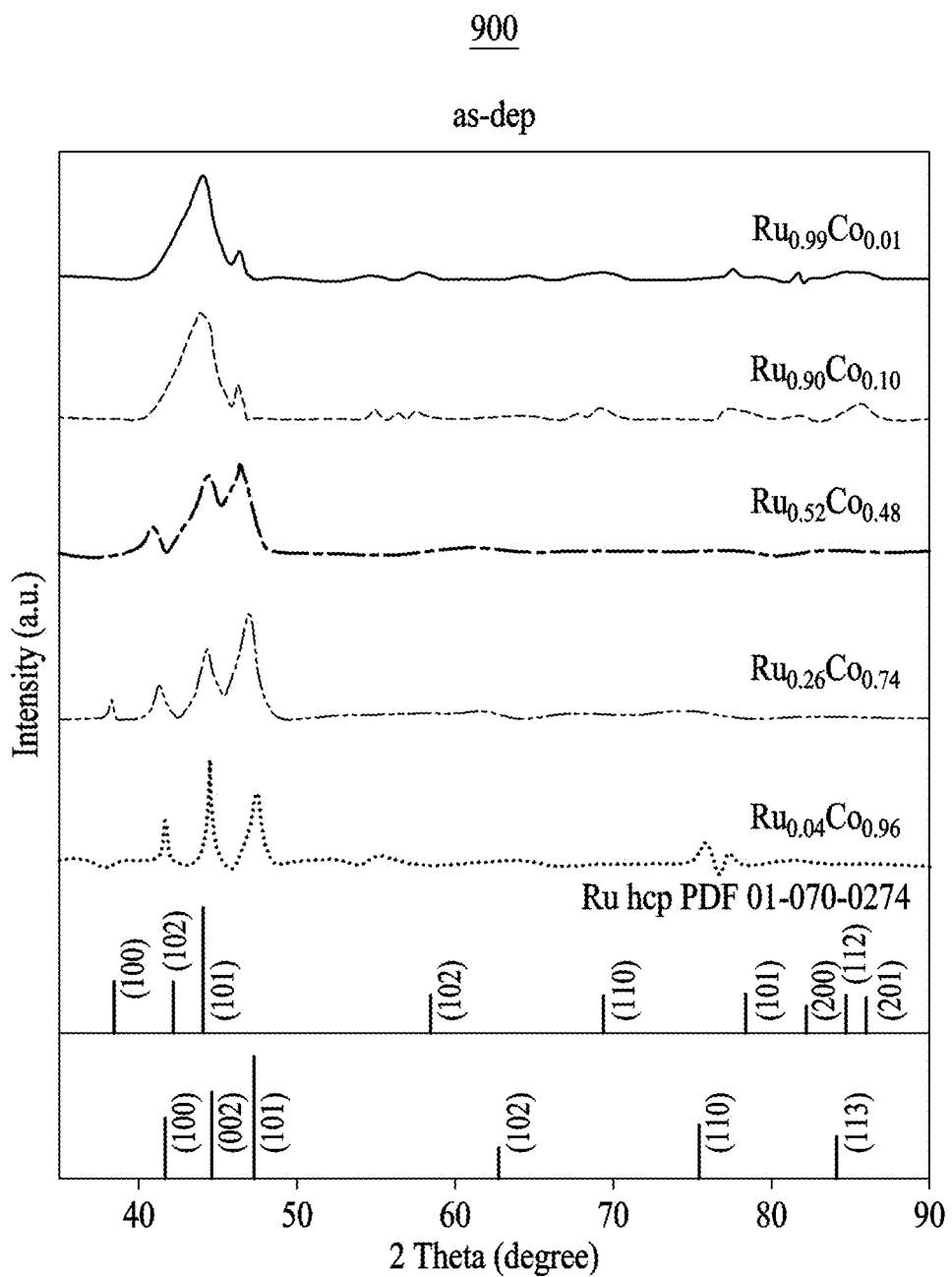
FIGS. 9A to 9D illustrate composition-dependent X-ray diffraction analysis results and cobalt composition-dependent crystal grain size changes of ruthenium-cobalt alloy nanowires according to embodiments of the present disclosure.
Figure 9B:
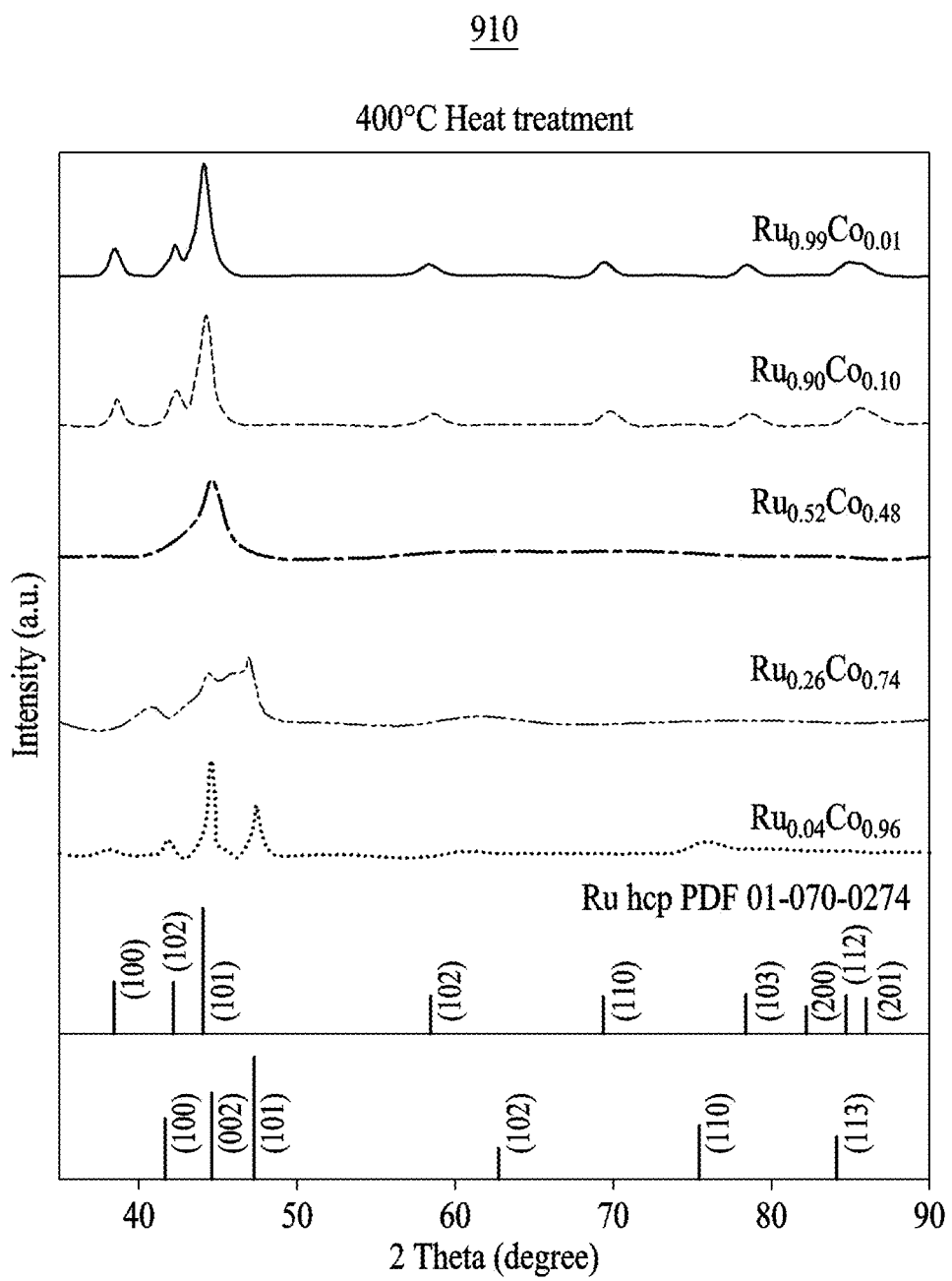

Graph 900 of FIG. 9A illustrates analysis results of the ruthenium-cobalt alloy nanowires that have been subjected to electroplating (as-deposited), and graph 910 of FIG. 9B illustrates analysis results of ruthenium-cobalt nanowires annealed at 450° C. for 3 hours.

Figure 9C:
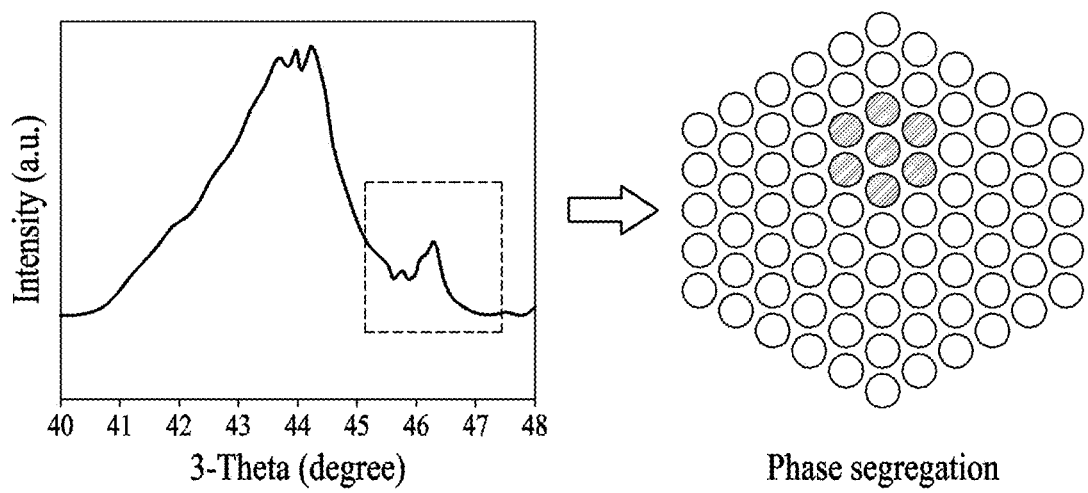
Figure 9C:
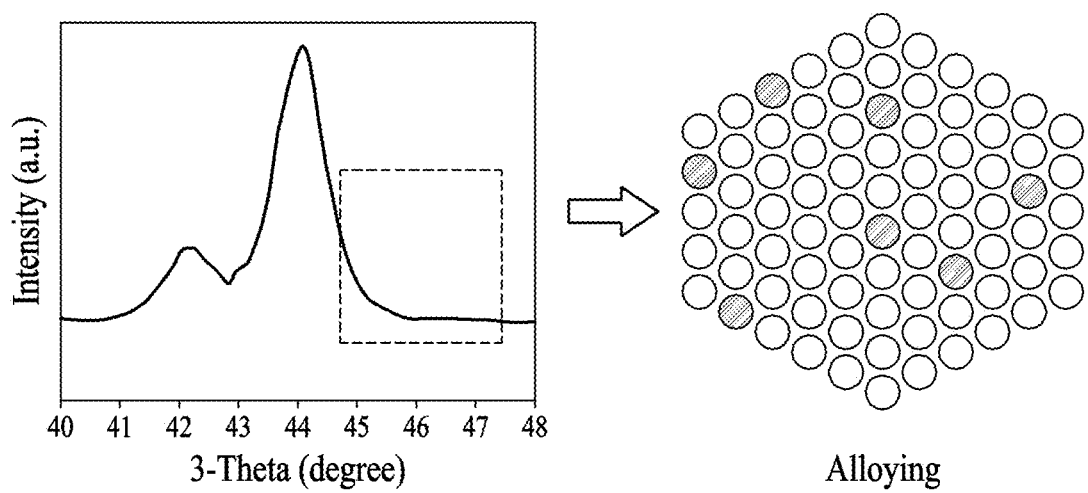

Graph 920 of FIG. 9C illustrates an enlarged X-ray diffraction result of ruthenium-cobalt alloy nanowires, in which the content of cobalt is 1 at %, after being subjected to plating, and an enlarged X-ray diffraction result of the ruthenium-cobalt alloy nanowires after being annealed at 450° C.

Referring to graph 920, the graph showing a state after being plated (as-deposited) illustrates peaks of ruthenium and cobalt at the same time. This may mean that ruthenium and cobalt are phase-segregated in the ruthenium-cobalt alloy nanowires.

However, a ruthenium peak is only observed in X-ray diffraction data of the ruthenium-cobalt alloy nanowires that have been annealed at 450° C. in a temperature range used in a semiconductor back-end-of-line (BEOL). This indicates that cobalt moves into the ruthenium matrix so that an alloy is formed.

That is, a ruthenium-cobalt complete solid solution is formed through annealing so that electrical resistivity of the ruthenium-cobalt alloy nanowires is reduced.

Figure 9D:
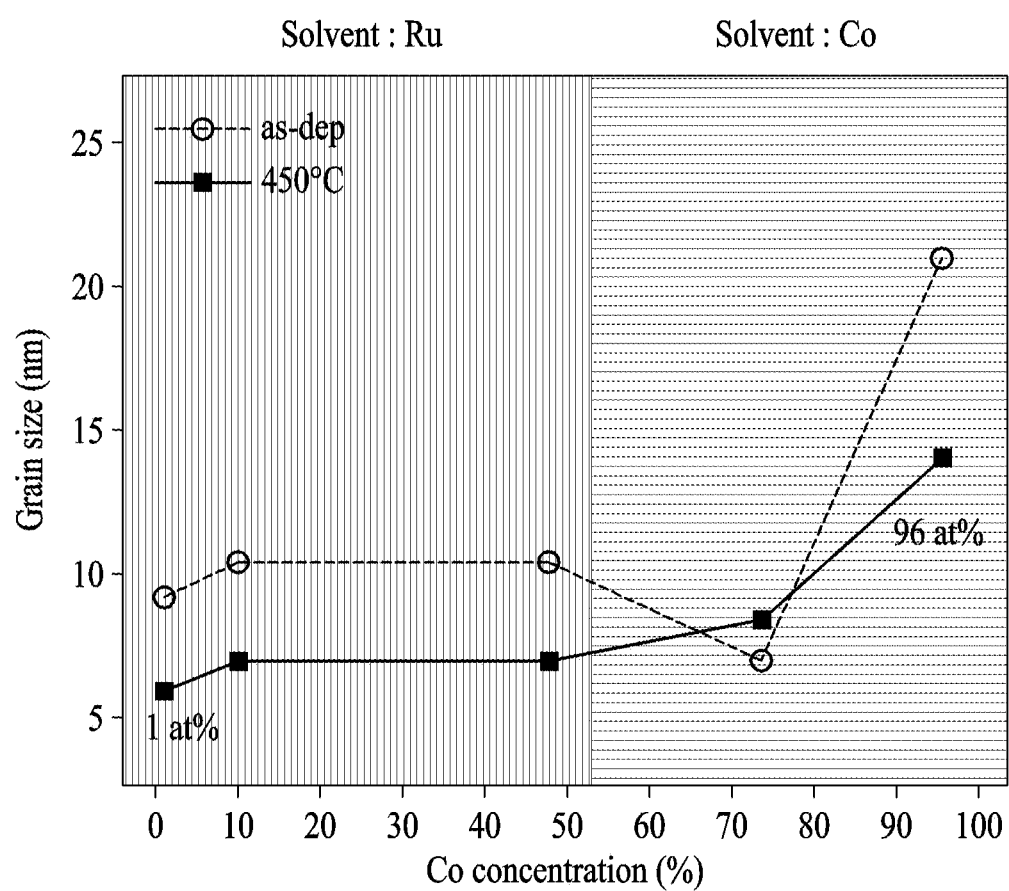

Graph 930 of FIG. 9D illustrates crystal grain sizes of ruthenium-cobalt alloy nanowires, by composition, related to a cobalt content (concentration), based on graphs 900 and 910.

Referring to graph 930, it can be confirmed that the size of crystal grains tends to increase with increasing cobalt content.

That is, the size of crystal grains of the ruthenium-cobalt alloy nanowires may increase with increasing cobalt content.

Figure 10:
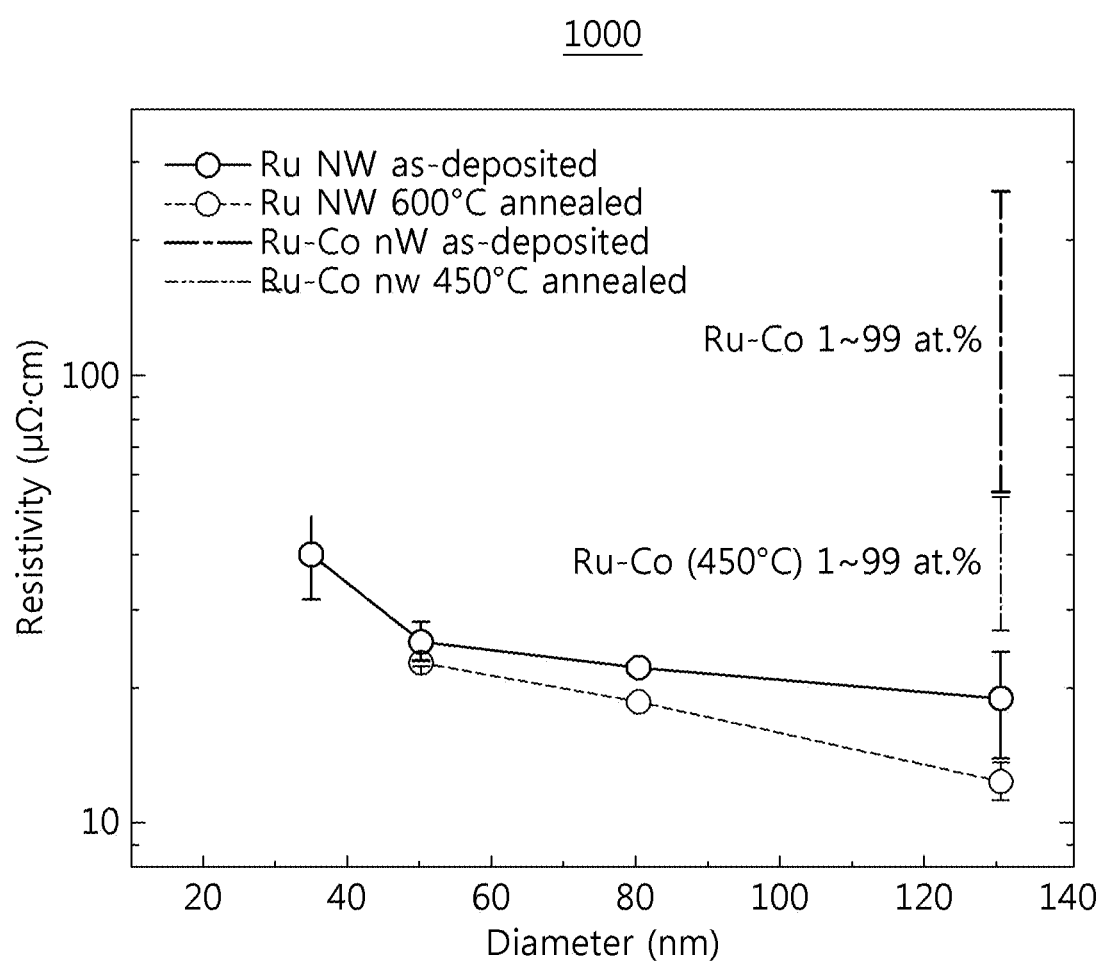
FIG. 10 illustrates electrical property changes before and after annealing of ruthenium-based nanowires according to an embodiment of the present disclosure; and FIG. 11A to FIG. 11C illustrates an application example of ruthenium-based nanowires according to an embodiment of the present disclosure.

FIG. 10 illustrates electrical property changes before and after annealing of ruthenium-based nanowires according to an embodiment of the present disclosure.

More particularly, FIG. 10 illustrates electrical property changes, before and after annealing, of ruthenium-cobalt alloy nanowires (Ru—Co NW) with a diameter of 130 nm and ruthenium nanowires (RU NW) with a diameter of 130 nm.

Referring to FIG. 10, graph 1000 illustrates electrical resistivity changes dependent upon a diameter.

Referring to graph 1000, ruthenium-cobalt alloy nanowires after being plated (as-deposited) have an electrical resistivity of 32.8 to 365.9 μΩ·cm, and the electrical resistivity is greatly reduced to 27.2 to 54.1 μΩ·cm after annealing at 450° C.

In addition, ruthenium nanowires with a diameter of 130 nm after being plated (as-deposited) have an electrical resistivity of about 22 μΩ·cm, and the electrical resistivity is reduced to about 13 μΩ·cm after annealing at 450° C.

Accordingly, the ruthenium-based nanowires according to an embodiment of the present disclosure may be applied to a single-layer alloying approach method to replace an existing double-layer structure. The single-layer alloying approach method may cause an amorphous structure or crystal grain stuffing effect, thereby improving barrier properties. In addition, the amorphous structure serves to remove a diffusion path through crystal grain boundaries, so that excellent anti-diffusion characteristics are exhibited.

In addition, the single-layer alloying material of the ruthenium-cobalt alloy nanowires according to an embodiment may have an electrical resistivity value lower than that of a nitride (TaN, specific resistance: 160 to 400 μΩ·cm) while reducing interface resistance caused by a multi-layer structure.

Figure 11A:
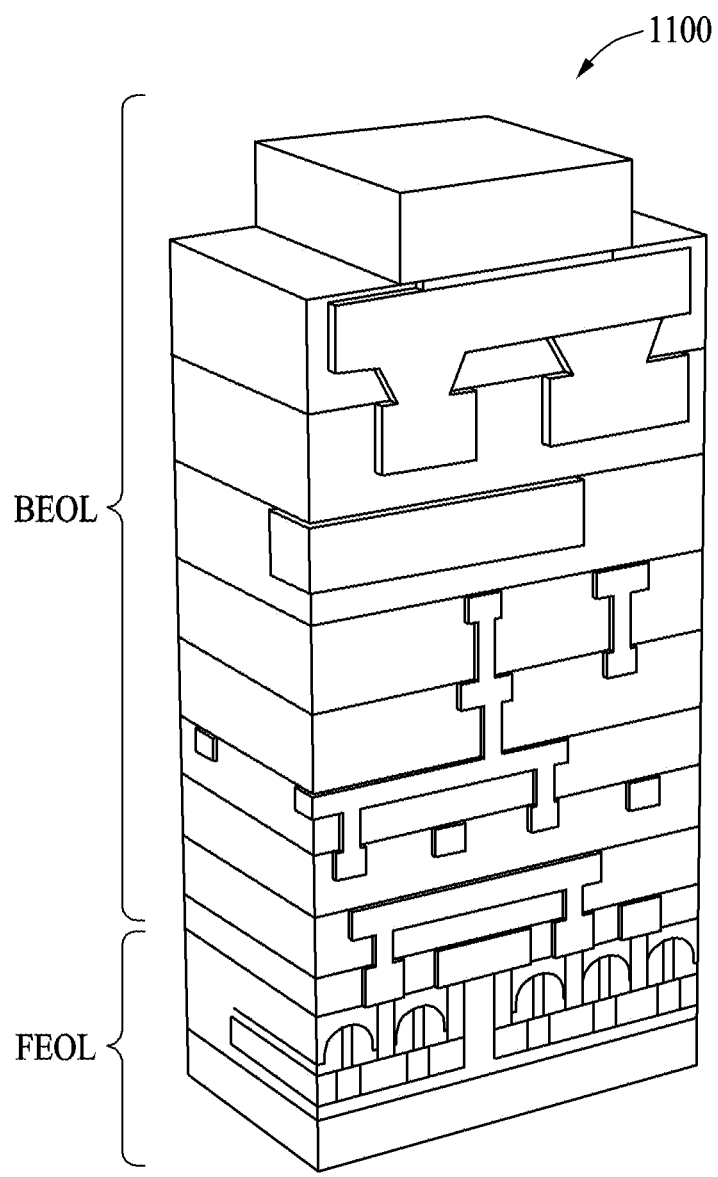
Figure 11B:
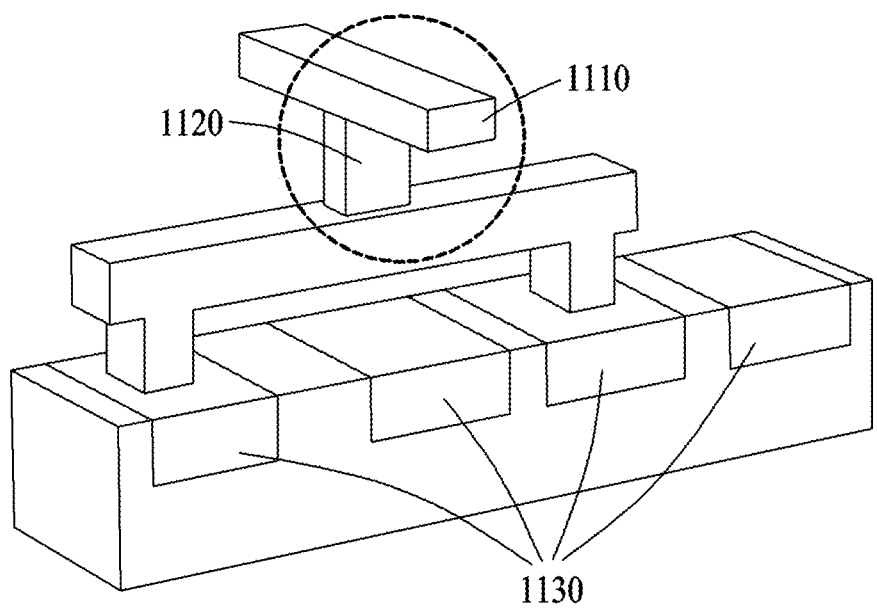
Figure 11C:
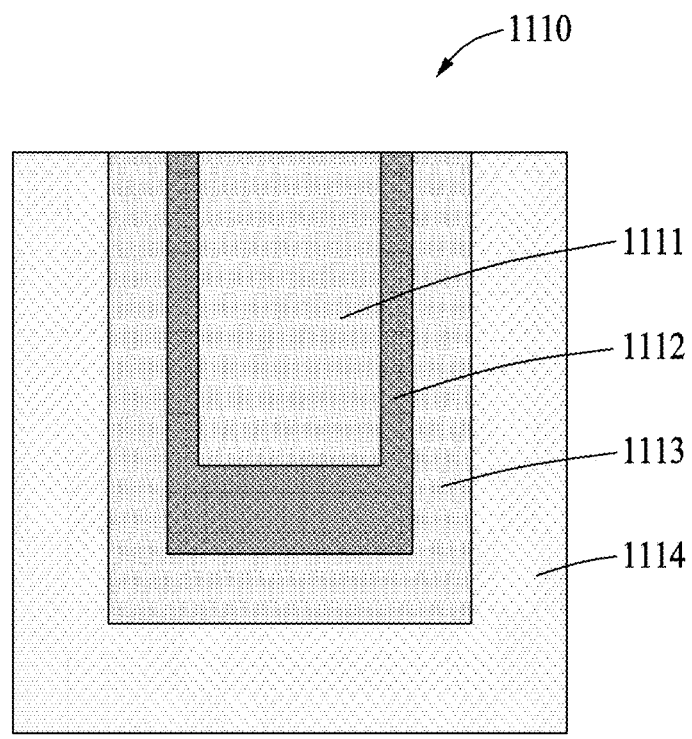

FIGS. 11A to 11C illustrate application examples of ruthenium-based nanowires according to an embodiment of the present disclosure.

Referring to FIGS. 11A to 11C, FIG. 11A illustrates a semiconductor device 1100 including a back end of line (BEOL) layer and a front end of line (FEOL) layer, FIG. 11B illustrates a metal line 1110 and via 1120 included in the BEOL layer of the semiconductor device 1100, and FIG. 11C illustrates a metal line 1110 including a metal layer 1111, a liner 1112, a barrier 1113 and a dielectric layer 1114.

For example, devices 1130 illustrated in FIG. 11B may be transistor devices, and the metal layer 1111 may include copper metal.

In particular, the ruthenium-based nanowires according to an embodiment of the present disclosure may be applied, in the form of at least one of a barrier and a liner, to at least one of the metal line 1110, via 1120 and contact included in the BEOL layer of the semiconductor device 1100.

For example, the ruthenium-based nanowires may be applied as the liner 1112 and the barrier 1113 to be formed on the metal layer 1111 of the metal line 1110.

The ruthenium-based nanowires according to an embodiment of the present disclosure may include ruthenium nanowires and ruthenium-cobalt alloy nanowires.

In other words, the ruthenium-based nanowires according to an embodiment may replace an existing Ta liner and TaN barrier formed on copper metal lines. Accordingly, rapid resistance increase in copper metal lines may be prevented, and the thickness of a barrier/liner double layer may be reduced.

That is, the ruthenium-cobalt alloy nanowires according to an embodiment of the present disclosure may be applied, in the form of at least one of a barrier and a liner, to at least one of the metal line 1110, via 1120 and contact included in the BEOL layer of the semiconductor device.

In conclusion, the present disclosure can provide ruthenium-based nanowires having an amorphous structure and low electrical resistivity, through electroplating.

In addition, the ruthenium-based nanowires according to an embodiment of the present disclosure act as a barrier for preventing diffusion of a metal line into a low-k dielectric material and a liner for metal line plating, so that the ruthenium-based nanowires may be provided in the form of a single layer applicable to a metallization process.

As apparent from the above description, ruthenium and ruthenium-cobalt alloy nanowires having small diameters can be synthesized using electroplating according to the present disclosure, thereby providing a material having lower electrical resistivity than that of existing wiring materials.

The present disclosure can provide ruthenium and ruthenium-cobalt alloy nanowires that act as a barrier for preventing diffusion of a metal line into a low-k dielectric material and a liner for metal line plating and, accordingly, are capable of being used in the form of a single layer in a metallization process; and a method of manufacturing the ruthenium and ruthenium-cobalt alloy nanowires.

Although the present disclosure has been described with reference to limited embodiments and drawings, it should be understood by those skilled in the art that various changes and modifications may be made therein. For example, the described techniques may be performed in a different order than the described methods, and/or components of the described systems, structures, devices, circuits, etc., may be combined in a manner that is different from the described method, or appropriate results may be achieved even if replaced by other components or equivalents.

Therefore, other embodiments, other examples, and equivalents to the claims are within the scope of the following claims.

DESCRIPTION OF SYMBOL

100: ruthenium-based nanowires

What is claimed is:

1. A method of manufacturing a nanowire having a ruthenium nanowire within a silica nanotube, the method comprising:
   forming a silica nanotube by depositing silica (SiO$_2$) layer on an inner surface of a pore of a porous template using atomic layer deposition (ALD);
   forming the ruthenium nanowire on the silica (SiO$_2$) layer by reducing ruthenium (Ru) in the silica nanotube formed on the porous template using electroplating; and
   annealing the formed ruthenium nanowire,
   wherein a size of crystal grains of the annealed ruthenium nanowire within the silica nanotube is determined based on an annealing temperature of the annealing.

2. The method according to claim 1, wherein a thickness of the silica (SiO$_2$) layer formed on an inner surface the pore of the porous template is 5 nm to 30 nm.

3. The method according to claim 1, wherein the porous template comprises any one of a polycarbonate membrane (PCM) and an anodic aluminum oxide (AAO) membrane.

4. The method according to claim 1, wherein the annealing is performed at 400° C. to 600° C.

5. The method according to claim 4, wherein the size of crystal grains of the annealed ruthenium nanowire in the silica nanotube is within 9 nm to 12 nm.

6. A method of manufacturing a nanowire having a ruthenium nanowire within a silica nanotube, the method comprising:
   forming a silica nanotube by depositing silica (SiO$_2$) layer on an inner surface of a pore of a porous template using atomic layer deposition (ALD);
   forming the ruthenium nanowire on the silica (SiO$_2$) layer by reducing ruthenium (Ru) in the silica nanotube formed on the porous template using electroplating with deionized water-based solution including boric acid ($H_3BO_3$) and citric acid ($C_6H_8O_7$) as buffering agents; and annealing the formed ruthenium nanowire, wherein a size of crystal grains of the annealed ruthenium nanowire within the silica nanotube is determined based on an annealing temperature of the annealing.

7. A method of manufacturing a nanowire having a ruthenium-cobalt alloy nanowire within a silica nanotube, the method comprising:

forming a silica nanotube by depositing silica ($SiO_2$) layer on an inner surface of a pore of a porous template using atomic layer deposition (ALD);

forming a ruthenium-cobalt alloy nanowire on the silica ($SiO_2$) layer by reducing ruthenium (Ru) and cobalt (Co) in the silica nanotube on the porous template using electroplating; and annealing the formed ruthenium-cobalt alloy nanowire at 400° C. to 600° C., wherein
the ruthenium-cobalt alloy nanowire comprises a ruthenium (Ru)-cobalt (Co) complete solid solution, and
the ruthenium (Ru)-cobalt (Co) complete solid solution is formed by moving cobalt (Co) into a ruthenium (Ru) matrix after the annealing so that electrical resistivity of the annealed ruthenium-cobalt alloy nanowire is reduced through annealing.

8. The method according to claim 7,
wherein the crystal structure is an amorphous-like structure when the content of the cobalt (Co) is 1 at % to 48 at %.

9. The method according to claim 7, wherein a size of crystal grains of the ruthenium-cobalt alloy nanowire increases when the content of the cobalt (Co) increases.

10. The method according to claim 7, wherein the content of cobalt (Co) is controlled by adjusting at least one of a precursor concentration of cobalt (Co) and a current density of the electroplating.

* * * * *